United States Patent
Rajan et al.

(10) Patent No.: US 8,797,779 B2
(45) Date of Patent: Aug. 5, 2014

(54) MEMORY MODULE WITH MEMORY STACK AND INTERFACE WITH ENHANCED CAPABILITES

(75) Inventors: Suresh Natarajan Rajan, San Jose, CA (US); Keith R. Schakel, San Jose, CA (US); Michael J. S. Smith, Palo Alto, CA (US); David T. Wang, Thousand Oaks, CA (US); Frederick Daniel Weber, San Jose, CA (US)

(73) Assignee: Google Inc., Mountain View, CA (US)

( * ) Notice: Subject to any disclaimer, the term of this patent is extended or adjusted under 35 U.S.C. 154(b) by 0 days.

(21) Appl. No.: 13/620,425

(22) Filed: Sep. 14, 2012

(65) Prior Publication Data

US 2013/0103896 A1 Apr. 25, 2013

Related U.S. Application Data

(60) Continuation of application No. 13/341,844, filed on Dec. 30, 2011, which is a division of application No. 11/702,981, filed on Feb. 5, 2007, now Pat. No. 8,089,795, and a continuation-in-part of application No. 11/461,437, filed on Jul. 31, 2006, now Pat. No. 8,077,535.

(60) Provisional application No. 60/772,414, filed on Feb. 9, 2006, provisional application No. 60/865,624, filed on Nov. 13, 2006.

(51) Int. Cl.
*G11C 5/06* (2006.01)
*G11C 11/4093* (2006.01)

(52) U.S. Cl.
CPC ................... *G11C 11/4093* (2013.01)
USPC ............................. 365/63; 712/37

(58) Field of Classification Search
USPC ......................... 365/63; 712/37, 38
See application file for complete search history.

(56) References Cited

U.S. PATENT DOCUMENTS 3,800,292 A 3/1974 Curley et al.
4,069,452 A 1/1978 Conway et al.
(Continued)

FOREIGN PATENT DOCUMENTS

DE 102004051345 5/2006
DE 102004053316 5/2006
(Continued)

OTHER PUBLICATIONS

Final Office Action from U.S. Appl. No. 13/620,650, Dated Aug. 30, 2013.

(Continued)

*Primary Examiner* — Vu Le
(74) *Attorney, Agent, or Firm* — Fish & Richardson P.C.

(57) ABSTRACT

A memory module, which includes at least one memory stack, comprises a plurality of DRAM integrated circuits and an interface circuit. The interface circuit interfaces the memory stack to a host system so as to operate the memory stack as a single DRAM integrated circuit. In other embodiments, a memory module includes at least one memory stack and a buffer integrated circuit. The buffer integrated circuit, coupled to a host system, interfaces the memory stack to the host system so to operate the memory stack as at least two DRAM integrated circuits. In yet other embodiments, the buffer circuit interfaces the memory stack to the host system for transforming one or more physical parameters between the DRAM integrated circuits and the host system.

20 Claims, 16 Drawing Sheets

(56) References Cited

U.S. PATENT DOCUMENTS

| | | |
|---|---|---|
| 4,323,965 A | 4/1982 | Johnson et al. |
| 4,334,307 A | 6/1982 | Bourgeois et al. |
| 4,345,319 A | 8/1982 | Bernardini et al. |
| 4,392,212 A | 7/1983 | Miyasaka et al. |
| 4,500,958 A | 2/1985 | Manton et al. |
| 4,525,921 A | 7/1985 | Carson et al. |
| 4,566,082 A | 1/1986 | Anderson |
| 4,592,019 A | 5/1986 | Huang et al. |
| 4,628,407 A | 12/1986 | August et al. |
| 4,646,128 A | 2/1987 | Carson et al. |
| 4,698,748 A | 10/1987 | Juzswik et al. |
| 4,706,166 A | 11/1987 | Go |
| 4,710,903 A | 12/1987 | Hereth et al. |
| 4,764,846 A | 8/1988 | Go |
| 4,780,843 A | 10/1988 | Tietjen |
| 4,794,597 A | 12/1988 | Ooba et al. |
| 4,796,232 A | 1/1989 | House |
| 4,807,191 A | 2/1989 | Flannagan |
| 4,841,440 A | 6/1989 | Yonezu et al. |
| 4,862,347 A | 8/1989 | Rudy |
| 4,884,237 A | 11/1989 | Mueller et al. |
| 4,887,240 A | 12/1989 | Garverick et al. |
| 4,888,687 A | 12/1989 | Allison et al. |
| 4,899,107 A | 2/1990 | Corbett et al. |
| 4,912,678 A | 3/1990 | Mashiko |
| 4,916,575 A | 4/1990 | Van Asten |
| 4,922,451 A | 5/1990 | Lo et al. |
| 4,935,734 A | 6/1990 | Austin |
| 4,937,791 A | 6/1990 | Steele et al. |
| 4,956,694 A | 9/1990 | Eide |
| 4,982,365 A | 1/1991 | Ohtani et al. |
| 4,983,533 A | 1/1991 | Go |
| 5,025,364 A | 6/1991 | Zellmer |
| 5,072,424 A | 12/1991 | Brent et al. |
| 5,083,266 A | 1/1992 | Watanabe |
| 5,104,820 A | 4/1992 | Go et al. |
| 5,193,072 A | 3/1993 | Frenkil et al. |
| 5,212,666 A | 5/1993 | Takeda |
| 5,220,672 A | 6/1993 | Nakao et al. |
| 5,222,014 A | 6/1993 | Lin |
| 5,241,266 A | 8/1993 | Ahmad et al. |
| 5,252,807 A | 10/1993 | Chizinsky |
| 5,257,233 A | 10/1993 | Schaefer |
| 5,278,796 A | 1/1994 | Tillinghast et al. |
| 5,282,177 A | 1/1994 | McLaury |
| 5,332,922 A | 7/1994 | Oguchi et al. |
| 5,347,428 A | 9/1994 | Carson et al. |
| 5,369,749 A | 11/1994 | Baker et al. |
| 5,384,745 A | 1/1995 | Konishi et al. |
| 5,388,265 A | 2/1995 | Volk |
| 5,390,078 A | 2/1995 | Taylor |
| 5,390,334 A | 2/1995 | Harrison |
| 5,392,251 A | 2/1995 | Manning |
| 5,408,190 A | 4/1995 | Wood et al. |
| 5,432,729 A | 7/1995 | Carson et al. |
| 5,448,511 A | 9/1995 | Paurus et al. |
| 5,453,434 A | 9/1995 | Albaugh et al. |
| 5,467,455 A | 11/1995 | Gay et al. |
| 5,483,497 A | 1/1996 | Mochizuki et al. |
| 5,498,886 A | 3/1996 | Hsu et al. |
| 5,502,333 A | 3/1996 | Bertin et al. |
| 5,502,667 A | 3/1996 | Bertin et al. |
| 5,513,135 A | 4/1996 | Dell et al. |
| 5,513,339 A | 4/1996 | Agrawal et al. |
| 5,519,832 A | 5/1996 | Warchol |
| 5,526,320 A | 6/1996 | Zagar et al. |
| 5,530,836 A | 6/1996 | Busch et al. |
| 5,550,781 A | 8/1996 | Sugawara et al. |
| 5,559,990 A | 9/1996 | Cheng et al. |
| 5,561,622 A | 10/1996 | Bertin et al. |
| 5,563,086 A | 10/1996 | Bertin et al. |
| 5,566,344 A | 10/1996 | Hall et al. |
| 5,581,498 A | 12/1996 | Ludwig et al. |
| 5,581,779 A | 12/1996 | Hall et al. |
| 5,590,071 A | 12/1996 | Kolor et al. |
| 5,598,376 A | 1/1997 | Merritt et al. |
| 5,604,714 A | 2/1997 | Manning et al. |
| 5,606,710 A | 2/1997 | Hall et al. |
| 5,608,262 A | 3/1997 | Degani et al. |
| 5,610,864 A | 3/1997 | Manning |
| 5,623,686 A | 4/1997 | Hall et al. |
| 5,627,791 A | 5/1997 | Wright et al. |
| 5,640,337 A | 6/1997 | Huang et al. |
| 5,640,364 A | 6/1997 | Merritt et al. |
| 5,652,724 A | 7/1997 | Manning |
| 5,654,204 A | 8/1997 | Anderson |
| 5,661,677 A | 8/1997 | Rondeau et al. |
| 5,661,695 A | 8/1997 | Zagar et al. |
| 5,668,773 A | 9/1997 | Zagar et al. |
| 5,675,549 A | 10/1997 | Ong et al. |
| 5,680,342 A | 10/1997 | Frankeny |
| 5,682,354 A | 10/1997 | Manning |
| 5,692,121 A | 11/1997 | Bozso et al. |
| 5,692,202 A | 11/1997 | Kardach et al. |
| 5,696,732 A | 12/1997 | Zagar et al. |
| 5,696,929 A | 12/1997 | Hasbun et al. |
| 5,702,984 A | 12/1997 | Bertin et al. |
| 5,703,813 A | 12/1997 | Manning et al. |
| 5,706,247 A | 1/1998 | Merritt et al. |
| RE35,733 E | 2/1998 | Hernandez et al. |
| 5,717,654 A | 2/1998 | Manning |
| 5,721,859 A | 2/1998 | Manning |
| 5,724,288 A | 3/1998 | Cloud et al. |
| 5,729,503 A | 3/1998 | Manning |
| 5,729,504 A | 3/1998 | Cowles |
| 5,742,792 A | 4/1998 | Yanai et al. |
| 5,748,914 A | 5/1998 | Barth et al. |
| 5,752,045 A | 5/1998 | Chen |
| 5,757,703 A | 5/1998 | Merritt et al. |
| 5,760,478 A | 6/1998 | Bozso et al. |
| 5,761,703 A | 6/1998 | Bolyn |
| 5,765,203 A | 6/1998 | Sangha |
| 5,781,766 A | 7/1998 | Davis |
| 5,787,457 A | 7/1998 | Miller et al. |
| 5,798,961 A | 8/1998 | Heyden et al. |
| 5,802,010 A | 9/1998 | Zagar et al. |
| 5,802,395 A | 9/1998 | Connolly et al. |
| 5,802,555 A | 9/1998 | Shigeeda |
| 5,812,488 A | 9/1998 | Zagar et al. |
| 5,819,065 A | 10/1998 | Chilton et al. |
| 5,831,833 A | 11/1998 | Shirakawa et al. |
| 5,831,931 A | 11/1998 | Manning |
| 5,831,932 A | 11/1998 | Merritt et al. |
| 5,834,838 A | 11/1998 | Anderson |
| 5,835,435 A | 11/1998 | Bogin et al. |
| 5,838,165 A | 11/1998 | Chatter |
| 5,838,177 A | 11/1998 | Keeth |
| 5,841,580 A | 11/1998 | Farmwald et al. |
| 5,843,799 A | 12/1998 | Hsu et al. |
| 5,843,807 A | 12/1998 | Burns |
| 5,845,108 A | 12/1998 | Yoo et al. |
| 5,850,368 A | 12/1998 | Ong et al. |
| 5,859,792 A | 1/1999 | Rondeau et al. |
| 5,860,106 A | 1/1999 | Domen et al. |
| 5,870,347 A | 2/1999 | Keeth et al. |
| 5,870,350 A | 2/1999 | Bertin et al. |
| 5,872,907 A | 2/1999 | Griess et al. |
| 5,875,142 A | 2/1999 | Chevallier |
| 5,878,279 A | 3/1999 | Athenes |
| 5,884,088 A | 3/1999 | Kardach et al. |
| 5,901,105 A | 5/1999 | Ong et al. |
| 5,903,500 A | 5/1999 | Tsang et al. |
| 5,905,688 A | 5/1999 | Park |
| 5,907,512 A | 5/1999 | Parkinson et al. |
| 5,910,010 A | 6/1999 | Nishizawa et al. |
| 5,913,072 A | 6/1999 | Wieringa |
| 5,915,105 A | 6/1999 | Farmwald et al. |
| 5,915,167 A | 6/1999 | Leedy |
| 5,917,758 A | 6/1999 | Keeth |
| 5,923,611 A | 7/1999 | Ryan |
| 5,924,111 A | 7/1999 | Huang et al. |
| 5,926,435 A | 7/1999 | Park et al. |
| 5,929,650 A | 7/1999 | Pappert et al. |
| 5,943,254 A | 8/1999 | Bakeman, Jr. et al. |

(56) References Cited

U.S. PATENT DOCUMENTS

| | | |
|---|---|---|
| 5,946,265 A | 8/1999 | Cowles |
| 5,949,254 A | 9/1999 | Keeth |
| 5,953,215 A | 9/1999 | Karabatsos |
| 5,953,263 A | 9/1999 | Farmwald et al. |
| 5,954,804 A | 9/1999 | Farmwald et al. |
| 5,956,233 A | 9/1999 | Yew et al. |
| 5,960,468 A | 9/1999 | Paluch |
| 5,962,435 A | 10/1999 | Mao et al. |
| 5,963,429 A | 10/1999 | Chen |
| 5,963,463 A | 10/1999 | Rondeau et al. |
| 5,963,464 A | 10/1999 | Dell et al. |
| 5,963,504 A | 10/1999 | Manning |
| 5,966,724 A | 10/1999 | Ryan |
| 5,966,727 A | 10/1999 | Nishino |
| 5,969,996 A | 10/1999 | Muranaka et al. |
| 5,973,392 A | 10/1999 | Senba et al. |
| 5,978,304 A | 11/1999 | Crafts |
| 5,995,424 A | 11/1999 | Lawrence et al. |
| 5,995,443 A | 11/1999 | Farmwald et al. |
| 6,001,671 A | 12/1999 | Fjelstad |
| 6,002,613 A | 12/1999 | Cloud et al. |
| 6,002,627 A | 12/1999 | Chevallier |
| 6,014,339 A | 1/2000 | Kobayashi et al. |
| 6,016,282 A | 1/2000 | Keeth |
| 6,026,027 A | 2/2000 | Terrell, II et al. |
| 6,026,050 A | 2/2000 | Baker et al. |
| 6,029,250 A | 2/2000 | Keeth |
| 6,032,214 A | 2/2000 | Farmwald et al. |
| 6,032,215 A | 2/2000 | Farmwald et al. |
| 6,034,916 A | 3/2000 | Lee |
| 6,034,918 A | 3/2000 | Farmwald et al. |
| 6,035,365 A | 3/2000 | Farmwald et al. |
| 6,038,195 A | 3/2000 | Farmwald et al. |
| 6,038,673 A | 3/2000 | Benn et al. |
| 6,044,028 A | 3/2000 | Kumagai et al. |
| 6,044,032 A | 3/2000 | Li |
| 6,047,073 A | 4/2000 | Norris et al. |
| 6,047,344 A | 4/2000 | Kawasumi et al. |
| 6,047,361 A | 4/2000 | Ingenio et al. |
| 6,053,948 A | 4/2000 | Vaidyanathan et al. |
| 6,058,451 A | 5/2000 | Bermingham et al. |
| 6,065,092 A | 5/2000 | Roy |
| 6,069,504 A | 5/2000 | Keeth |
| 6,070,217 A | 5/2000 | Connolly et al. |
| 6,073,223 A | 6/2000 | McAllister et al. |
| 6,075,730 A | 6/2000 | Barth et al. |
| 6,075,744 A | 6/2000 | Tsern et al. |
| 6,078,546 A | 6/2000 | Lee |
| 6,079,025 A | 6/2000 | Fung |
| 6,084,434 A | 7/2000 | Keeth |
| 6,088,290 A | 7/2000 | Ohtake et al. |
| 6,091,251 A | 7/2000 | Wood et al. |
| RE36,839 E | 8/2000 | Simmons et al. |
| 6,101,152 A | 8/2000 | Farmwald et al. |
| 6,101,564 A | 8/2000 | Athenes et al. |
| 6,101,612 A | 8/2000 | Jeddeloh |
| 6,108,795 A | 8/2000 | Jeddeloh |
| 6,111,812 A | 8/2000 | Gans et al. |
| 6,134,638 A | 10/2000 | Olarig et al. |
| 6,154,370 A | 11/2000 | Degani et al. |
| 6,166,991 A | 12/2000 | Phelan |
| 6,181,640 B1 | 1/2001 | Kang |
| 6,182,184 B1 | 1/2001 | Farmwald et al. |
| 6,199,151 B1 | 3/2001 | Williams et al. |
| 6,208,168 B1 | 3/2001 | Rhee |
| 6,216,246 B1 | 4/2001 | Shau |
| 6,222,739 B1 | 4/2001 | Bhakta et al. |
| 6,226,709 B1 | 5/2001 | Goodwin et al. |
| 6,226,730 B1 | 5/2001 | Murdoch et al. |
| 6,233,192 B1 | 5/2001 | Tanaka |
| 6,233,650 B1 | 5/2001 | Johnson et al. |
| 6,240,048 B1 | 5/2001 | Matsubara |
| 6,243,282 B1 | 6/2001 | Rondeau et al. |
| 6,252,807 B1 | 6/2001 | Suzuki et al. |
| 6,253,278 B1 | 6/2001 | Ryan |
| 6,260,097 B1 | 7/2001 | Farmwald et al. |
| 6,260,154 B1 | 7/2001 | Jeddeloh |
| 6,262,938 B1 | 7/2001 | Lee et al. |
| 6,266,285 B1 | 7/2001 | Farmwald et al. |
| 6,266,292 B1 | 7/2001 | Tsern et al. |
| 6,274,395 B1 | 8/2001 | Weber |
| 6,279,069 B1 | 8/2001 | Robinson et al. |
| 6,295,572 B1 | 9/2001 | Wu |
| 6,297,966 B1 | 10/2001 | Lee et al. |
| 6,298,426 B1 | 10/2001 | Ajanovic |
| 6,304,511 B1 | 10/2001 | Gans et al. |
| 6,307,769 B1 | 10/2001 | Nuxoll et al. |
| 6,314,051 B1 | 11/2001 | Farmwald et al. |
| 6,317,352 B1 | 11/2001 | Halbert et al. |
| 6,317,381 B1 | 11/2001 | Gans et al. |
| 6,324,120 B2 | 11/2001 | Farmwald et al. |
| 6,326,810 B1 | 12/2001 | Keeth |
| 6,327,664 B1 | 12/2001 | Dell et al. |
| 6,330,683 B1 | 12/2001 | Jeddeloh |
| 6,336,174 B1 | 1/2002 | Li et al. |
| 6,338,108 B1 | 1/2002 | Motomura |
| 6,338,113 B1 | 1/2002 | Kubo et al. |
| 6,341,347 B1 | 1/2002 | Joy et al. |
| 6,343,019 B1 | 1/2002 | Jiang et al. |
| 6,343,042 B1 | 1/2002 | Tsern et al. |
| 6,353,561 B1 | 3/2002 | Funyu et al. |
| 6,356,105 B1 | 3/2002 | Volk |
| 6,356,500 B1 | 3/2002 | Cloud et al. |
| 6,362,656 B2 | 3/2002 | Rhee |
| 6,363,031 B2 | 3/2002 | Phelan |
| 6,378,020 B2 | 4/2002 | Farmwald et al. |
| 6,381,188 B1 | 4/2002 | Choi et al. |
| 6,381,668 B1 | 4/2002 | Lunteren |
| 6,389,514 B1 | 5/2002 | Rokicki |
| 6,392,304 B1 | 5/2002 | Butler |
| 6,414,868 B1 | 7/2002 | Wong et al. |
| 6,418,034 B1 | 7/2002 | Weber et al. |
| 6,421,754 B1 | 7/2002 | Kau et al. |
| 6,424,532 B2 | 7/2002 | Kawamura |
| 6,426,916 B2 | 7/2002 | Farmwald et al. |
| 6,429,029 B1 | 8/2002 | Eldridge et al. |
| 6,430,103 B2 | 8/2002 | Nakayama et al. |
| 6,434,660 B1 | 8/2002 | Lambert et al. |
| 6,437,600 B1 | 8/2002 | Keeth |
| 6,438,057 B1 | 8/2002 | Ruckerbauer |
| 6,442,698 B2 | 8/2002 | Nizar |
| 6,445,591 B1 | 9/2002 | Kwong |
| 6,452,826 B1 | 9/2002 | Kim et al. |
| 6,452,863 B2 | 9/2002 | Farmwald et al. |
| 6,453,400 B1 * | 9/2002 | Maesako et al. ............... 711/167 |
| 6,453,402 B1 | 9/2002 | Jeddeloh |
| 6,453,434 B2 | 9/2002 | Delp et al. |
| 6,455,348 B1 | 9/2002 | Yamaguchi |
| 6,457,095 B1 | 9/2002 | Volk |
| 6,459,651 B1 | 10/2002 | Lee et al. |
| 6,473,831 B1 | 10/2002 | Schade |
| 6,476,476 B1 | 11/2002 | Glenn |
| 6,480,929 B1 | 11/2002 | Gauthier et al. |
| 6,487,102 B1 | 11/2002 | Halbert et al. |
| 6,489,669 B2 | 12/2002 | Shimada et al. |
| 6,490,161 B1 | 12/2002 | Johnson |
| 6,492,726 B1 | 12/2002 | Quek et al. |
| 6,493,789 B2 | 12/2002 | Ware et al. |
| 6,496,440 B2 | 12/2002 | Manning |
| 6,496,897 B2 | 12/2002 | Ware et al. |
| 6,498,766 B2 | 12/2002 | Lee et al. |
| 6,510,097 B2 | 1/2003 | Fukuyama |
| 6,510,503 B2 | 1/2003 | Gillingham et al. |
| 6,512,392 B2 | 1/2003 | Fleury et al. |
| 6,521,984 B2 | 2/2003 | Matsuura |
| 6,526,471 B1 | 2/2003 | Shimomura et al. |
| 6,526,473 B1 | 2/2003 | Kim |
| 6,526,484 B1 | 2/2003 | Stacovsky et al. |
| 6,545,895 B1 | 4/2003 | Li et al. |
| 6,546,446 B2 | 4/2003 | Farmwald et al. |
| 6,553,450 B1 | 4/2003 | Dodd et al. |
| 6,560,158 B2 | 5/2003 | Choi et al. |
| 6,563,337 B2 | 5/2003 | Dour |
| 6,563,759 B2 | 5/2003 | Yahata et al. |

(56) References Cited

U.S. PATENT DOCUMENTS

| | | |
|---|---|---|
| 6,564,281 B2 | 5/2003 | Farmwald et al. |
| 6,564,285 B1 | 5/2003 | Mills et al. |
| 6,574,150 B2 | 6/2003 | Suyama et al. |
| 6,584,037 B2 | 6/2003 | Farmwald et al. |
| 6,587,912 B2 | 7/2003 | Leddige et al. |
| 6,590,822 B2 | 7/2003 | Hwang et al. |
| 6,594,770 B1 | 7/2003 | Sato et al. |
| 6,597,616 B2 | 7/2003 | Tsern et al. |
| 6,597,617 B2 | 7/2003 | Ooishi et al. |
| 6,614,700 B2 | 9/2003 | Dietrich et al. |
| 6,618,267 B1 | 9/2003 | Dalal et al. |
| 6,618,791 B1 | 9/2003 | Dodd et al. |
| 6,621,760 B1 | 9/2003 | Ahmad et al. |
| 6,628,538 B2 | 9/2003 | Funaba et al. |
| 6,629,282 B1 * | 9/2003 | Sugamori et al. ............. 714/734 |
| 6,630,729 B2 | 10/2003 | Huang |
| 6,631,086 B1 | 10/2003 | Bill et al. |
| 6,639,820 B1 | 10/2003 | Khandekar et al. |
| 6,646,939 B2 | 11/2003 | Kwak |
| 6,650,588 B2 | 11/2003 | Yamagata |
| 6,650,594 B1 | 11/2003 | Lee et al. |
| 6,657,634 B1 | 12/2003 | Sinclair et al. |
| 6,657,918 B2 | 12/2003 | Foss et al. |
| 6,657,919 B2 | 12/2003 | Foss et al. |
| 6,658,016 B1 | 12/2003 | Dai et al. |
| 6,658,530 B1 | 12/2003 | Robertson et al. |
| 6,659,512 B1 | 12/2003 | Harper et al. |
| 6,664,625 B2 | 12/2003 | Hiruma |
| 6,665,224 B1 | 12/2003 | Lehmann et al. |
| 6,665,227 B2 | 12/2003 | Fetzer |
| 6,668,242 B1 | 12/2003 | Reynov et al. |
| 6,674,154 B2 | 1/2004 | Minamio et al. |
| 6,683,372 B1 | 1/2004 | Wong et al. |
| 6,684,292 B2 | 1/2004 | Piccirillo et al. |
| 6,690,191 B2 | 2/2004 | Wu et al. |
| 6,697,295 B2 | 2/2004 | Farmwald et al. |
| 6,701,446 B2 | 3/2004 | Tsern et al. |
| 6,705,877 B1 | 3/2004 | Li et al. |
| 6,708,144 B1 | 3/2004 | Merryman et al. |
| 6,710,430 B2 | 3/2004 | Minamio et al. |
| 6,711,043 B2 | 3/2004 | Friedman et al. |
| 6,713,856 B2 | 3/2004 | Tsai et al. |
| 6,714,433 B2 | 3/2004 | Doblar et al. |
| 6,714,891 B2 | 3/2004 | Dendinger |
| 6,724,684 B2 | 4/2004 | Kim |
| 6,730,540 B2 | 5/2004 | Siniaguine |
| 6,731,009 B1 | 5/2004 | Jones et al. |
| 6,731,527 B2 | 5/2004 | Brown |
| 6,742,098 B1 | 5/2004 | Halbert et al. |
| 6,744,687 B2 | 6/2004 | Koo et al. |
| 6,747,887 B2 | 6/2004 | Halbert et al. |
| 6,751,113 B2 | 6/2004 | Bhakta et al. |
| 6,751,696 B2 | 6/2004 | Farmwald et al. |
| 6,754,129 B2 | 6/2004 | Khatri et al. |
| 6,754,132 B2 | 6/2004 | Kyung |
| 6,757,751 B1 | 6/2004 | Gene |
| 6,762,948 B2 | 7/2004 | Kyun et al. |
| 6,765,812 B2 | 7/2004 | Anderson |
| 6,766,469 B2 | 7/2004 | Larson et al. |
| 6,771,526 B2 | 8/2004 | LaBerge |
| 6,772,359 B2 | 8/2004 | Kwak et al. |
| 6,779,097 B2 | 8/2004 | Gillingham et al. |
| 6,785,767 B2 | 8/2004 | Coulson |
| 6,791,877 B2 | 9/2004 | Miura et al. |
| 6,795,899 B2 | 9/2004 | Dodd et al. |
| 6,799,241 B2 | 9/2004 | Kahn et al. |
| 6,801,989 B2 | 10/2004 | Johnson et al. |
| 6,807,598 B2 | 10/2004 | Farmwald et al. |
| 6,807,650 B2 | 10/2004 | Lamb et al. |
| 6,807,655 B1 | 10/2004 | Rehani et al. |
| 6,810,475 B1 | 10/2004 | Tardieux |
| 6,816,991 B2 | 11/2004 | Sanghani |
| 6,819,602 B2 | 11/2004 | Seo et al. |
| 6,819,617 B2 | 11/2004 | Hwang et al. |
| 6,820,163 B1 | 11/2004 | McCall et al. |
| 6,820,169 B2 | 11/2004 | Wilcox et al. |
| 6,826,104 B2 | 11/2004 | Kawaguchi et al. |
| 6,839,290 B2 | 1/2005 | Ahmad et al. |
| 6,845,027 B2 | 1/2005 | Mayer et al. |
| 6,845,055 B1 | 1/2005 | Koga et al. |
| 6,847,582 B2 | 1/2005 | Pan |
| 6,850,449 B2 | 2/2005 | Takahashi |
| 6,854,043 B2 | 2/2005 | Hargis et al. |
| 6,862,202 B2 | 3/2005 | Schaefer |
| 6,862,249 B2 | 3/2005 | Kyung |
| 6,862,653 B1 | 3/2005 | Dodd et al. |
| 6,873,534 B2 | 3/2005 | Bhakta et al. |
| 6,878,570 B2 | 4/2005 | Lyu et al. |
| 6,894,933 B2 | 5/2005 | Kuzmenka et al. |
| 6,898,683 B2 | 5/2005 | Nakamura |
| 6,908,314 B2 | 6/2005 | Brown |
| 6,912,778 B2 | 7/2005 | Ahn et al. |
| 6,914,786 B1 | 7/2005 | Paulsen et al. |
| 6,917,219 B2 | 7/2005 | New |
| 6,922,371 B2 | 7/2005 | Takahashi et al. |
| 6,930,900 B2 | 8/2005 | Bhakta et al. |
| 6,930,903 B2 | 8/2005 | Bhakta et al. |
| 6,938,119 B2 | 8/2005 | Kohn et al. |
| 6,943,450 B2 | 9/2005 | Fee et al. |
| 6,944,748 B2 | 9/2005 | Sanches et al. |
| 6,947,341 B2 | 9/2005 | Stubbs et al. |
| 6,951,982 B2 | 10/2005 | Chye et al. |
| 6,952,794 B2 | 10/2005 | Lu |
| 6,961,281 B2 | 11/2005 | Wong et al. |
| 6,968,416 B2 | 11/2005 | Moy |
| 6,968,419 B1 | 11/2005 | Holman |
| 6,970,968 B1 | 11/2005 | Holman |
| 6,980,021 B1 | 12/2005 | Srivastava et al. |
| 6,986,118 B2 | 1/2006 | Dickman |
| 6,992,501 B2 | 1/2006 | Rapport |
| 6,992,950 B2 | 1/2006 | Foss et al. |
| 7,000,062 B2 | 2/2006 | Perego et al. |
| 7,003,618 B2 | 2/2006 | Perego et al. |
| 7,003,639 B2 | 2/2006 | Tsern et al. |
| 7,007,095 B2 | 2/2006 | Chen et al. |
| 7,007,175 B2 | 2/2006 | Chang et al. |
| 7,010,642 B2 | 3/2006 | Perego et al. |
| 7,010,736 B1 | 3/2006 | Teh et al. |
| 7,024,518 B2 | 4/2006 | Halbert et al. |
| 7,026,708 B2 | 4/2006 | Cady et al. |
| 7,028,215 B2 | 4/2006 | Depew et al. |
| 7,028,234 B2 | 4/2006 | Huckaby et al. |
| 7,033,861 B1 | 4/2006 | Partridge et al. |
| 7,035,150 B2 | 4/2006 | Streif et al. |
| 7,043,599 B1 | 5/2006 | Ware et al. |
| 7,043,611 B2 | 5/2006 | McClannahan et al. |
| 7,045,396 B2 | 5/2006 | Crowley et al. |
| 7,045,901 B2 | 5/2006 | Lin et al. |
| 7,046,538 B2 | 5/2006 | Kinsley et al. |
| 7,053,470 B1 | 5/2006 | Sellers et al. |
| 7,053,478 B2 | 5/2006 | Roper et al. |
| 7,058,776 B2 | 6/2006 | Lee |
| 7,058,863 B2 | 6/2006 | Kouchi et al. |
| 7,061,784 B2 | 6/2006 | Jakobs et al. |
| 7,061,823 B2 | 6/2006 | Faue et al. |
| 7,066,741 B2 | 6/2006 | Burns et al. |
| 7,075,175 B2 | 7/2006 | Kazi et al. |
| 7,079,396 B2 | 7/2006 | Gates et al. |
| 7,079,441 B1 | 7/2006 | Partsch et al. |
| 7,079,446 B2 | 7/2006 | Murtagh et al. |
| 7,085,152 B2 | 8/2006 | Ellis et al. |
| 7,085,941 B2 | 8/2006 | Li |
| 7,089,438 B2 | 8/2006 | Raad |
| 7,093,101 B2 | 8/2006 | Aasheim et al. |
| 7,103,730 B2 | 9/2006 | Saxena et al. |
| 7,111,143 B2 | 9/2006 | Walker |
| 7,117,309 B2 | 10/2006 | Bearden |
| 7,119,428 B2 | 10/2006 | Tanie et al. |
| 7,120,727 B2 | 10/2006 | Lee et al. |
| 7,126,399 B1 | 10/2006 | Lee |
| 7,127,567 B2 | 10/2006 | Ramakrishnan et al. |
| 7,133,960 B1 | 11/2006 | Thompson et al. |
| 7,136,978 B2 | 11/2006 | Miura et al. |
| 7,138,823 B2 | 11/2006 | Janzen et al. |

(56) References Cited

U.S. PATENT DOCUMENTS

| | | |
|---|---|---|
| 7,149,145 B2 | 12/2006 | Kim et al. |
| 7,149,824 B2 | 12/2006 | Johnson |
| 7,173,863 B2 | 2/2007 | Conley et al. |
| 7,200,021 B2 | 4/2007 | Raghuram |
| 7,205,789 B1 | 4/2007 | Karabatsos |
| 7,210,059 B2 | 4/2007 | Jeddeloh |
| 7,215,561 B2 | 5/2007 | Park et al. |
| 7,218,566 B1 | 5/2007 | Totolos, Jr. et al. |
| 7,224,595 B2 | 5/2007 | Dreps et al. |
| 7,228,264 B2 | 6/2007 | Barrenscheen et al. |
| 7,231,562 B2 | 6/2007 | Ohlhoff et al. |
| 7,233,541 B2 | 6/2007 | Yamamoto et al. |
| 7,234,081 B2 | 6/2007 | Nguyen et al. |
| 7,243,185 B2 | 7/2007 | See et al. |
| 7,245,541 B2 | 7/2007 | Janzen |
| 7,254,036 B2 | 8/2007 | Pauley et al. |
| 7,266,639 B2 | 9/2007 | Raghuram |
| 7,269,042 B2 | 9/2007 | Kinsley et al. |
| 7,269,708 B2 | 9/2007 | Ware |
| 7,274,583 B2 | 9/2007 | Park et al. |
| 7,277,333 B2 | 10/2007 | Schaefer |
| 7,286,436 B2 | 10/2007 | Bhakta et al. |
| 7,289,386 B2 | 10/2007 | Bhakta et al. |
| 7,296,754 B2 | 11/2007 | Nishizawa et al. |
| 7,299,330 B2 | 11/2007 | Gillingham et al. |
| 7,302,598 B2 | 11/2007 | Suzuki et al. |
| 7,307,863 B2 | 12/2007 | Yen et al. |
| 7,317,250 B2 | 1/2008 | Koh et al. |
| 7,327,613 B2 | 2/2008 | Lee |
| 7,336,490 B2 | 2/2008 | Harris et al. |
| 7,337,293 B2 | 2/2008 | Brittain et al. |
| 7,363,422 B2 | 4/2008 | Perego et al. |
| 7,366,947 B2 | 4/2008 | Gower et al. |
| 7,379,316 B2 | 5/2008 | Rajan |
| 7,386,656 B2 | 6/2008 | Rajan et al. |
| 7,392,338 B2 | 6/2008 | Rajan et al. |
| 7,408,393 B1 | 8/2008 | Jain et al. |
| 7,409,492 B2 | 8/2008 | Tanaka et al. |
| 7,414,917 B2 | 8/2008 | Ruckerbauer et al. |
| 7,428,644 B2 | 9/2008 | Jeddeloh et al. |
| 7,437,579 B2 | 10/2008 | Jeddeloh et al. |
| 7,441,064 B2 | 10/2008 | Gaskins |
| 7,457,122 B2 | 11/2008 | Lai et al. |
| 7,464,225 B2 | 12/2008 | Tsern |
| 7,472,220 B2 | 12/2008 | Rajan et al. |
| 7,474,576 B2 | 1/2009 | Co et al. |
| 7,480,147 B2 | 1/2009 | Hoss et al. |
| 7,480,774 B2 | 1/2009 | Ellis et al. |
| 7,496,777 B2 | 2/2009 | Kapil |
| 7,499,281 B2 | 3/2009 | Harris et al. |
| 7,515,453 B2 | 4/2009 | Rajan |
| 7,532,537 B2 | 5/2009 | Solomon et al. |
| 7,539,800 B2 | 5/2009 | Dell et al. |
| 7,573,136 B2 | 8/2009 | Jiang et al. |
| 7,580,312 B2 | 8/2009 | Rajan et al. |
| 7,581,121 B2 | 8/2009 | Barth et al. |
| 7,590,796 B2 | 9/2009 | Rajan et al. |
| 7,599,205 B2 | 10/2009 | Rajan |
| 7,606,245 B2 | 10/2009 | Ma et al. |
| 7,609,567 B2 | 10/2009 | Rajan et al. |
| 7,613,880 B2 | 11/2009 | Miura et al. |
| 7,619,912 B2 | 11/2009 | Bhakta et al. |
| 7,724,589 B2 | 5/2010 | Rajan et al. |
| 7,730,338 B2 | 6/2010 | Rajan et al. |
| 7,738,252 B2 | 6/2010 | Schuette et al. |
| 7,761,724 B2 | 7/2010 | Rajan et al. |
| 7,791,889 B2 | 9/2010 | Belady et al. |
| 7,911,798 B2 | 3/2011 | Chang et al. |
| 7,934,070 B2 | 4/2011 | Brittain et al. |
| 7,990,797 B2 | 8/2011 | Moshayedi et al. |
| 8,116,144 B2 | 2/2012 | Shaw et al. |
| 2001/0000822 A1 | 5/2001 | Dell et al. |
| 2001/0003198 A1 | 6/2001 | Wu |
| 2001/0011322 A1 | 8/2001 | Stolt et al. |
| 2001/0019509 A1 | 9/2001 | Aho et al. |
| 2001/0021106 A1 | 9/2001 | Weber et al. |
| 2001/0021137 A1 | 9/2001 | Kai et al. |
| 2001/0046129 A1 | 11/2001 | Broglia et al. |
| 2001/0046163 A1 | 11/2001 | Yanagawa |
| 2001/0052062 A1 | 12/2001 | Lipovski |
| 2002/0002662 A1 | 1/2002 | Olarig et al. |
| 2002/0004897 A1 | 1/2002 | Kao et al. |
| 2002/0015340 A1 | 2/2002 | Batinovich |
| 2002/0019961 A1 | 2/2002 | Blodgett |
| 2002/0034068 A1 | 3/2002 | Weber et al. |
| 2002/0038405 A1 | 3/2002 | Leddige et al. |
| 2002/0040416 A1 | 4/2002 | Tsern et al. |
| 2002/0041507 A1 | 4/2002 | Woo et al. |
| 2002/0051398 A1 | 5/2002 | Mizugaki |
| 2002/0060945 A1 | 5/2002 | Ikeda |
| 2002/0060948 A1 | 5/2002 | Chang et al. |
| 2002/0064073 A1 | 5/2002 | Chien |
| 2002/0064083 A1 | 5/2002 | Ryu et al. |
| 2002/0089831 A1 | 7/2002 | Forthun |
| 2002/0089970 A1 | 7/2002 | Asada et al. |
| 2002/0094671 A1 | 7/2002 | Distefano et al. |
| 2002/0121650 A1 | 9/2002 | Minamio et al. |
| 2002/0121670 A1 | 9/2002 | Minamio et al. |
| 2002/0124195 A1 | 9/2002 | Nizar |
| 2002/0129204 A1 | 9/2002 | Leighnor et al. |
| 2002/0145900 A1 | 10/2002 | Schaefer |
| 2002/0165706 A1 | 11/2002 | Raynham |
| 2002/0167092 A1 | 11/2002 | Fee et al. |
| 2002/0172024 A1 | 11/2002 | Hui et al. |
| 2002/0174274 A1 | 11/2002 | Wu et al. |
| 2002/0184438 A1 | 12/2002 | Usui |
| 2003/0002262 A1 | 1/2003 | Benisek et al. |
| 2003/0011993 A1 | 1/2003 | Summers et al. |
| 2003/0016550 A1 | 1/2003 | Yoo et al. |
| 2003/0021175 A1 | 1/2003 | Tae Kwak |
| 2003/0026155 A1 | 2/2003 | Yamagata |
| 2003/0026159 A1 | 2/2003 | Frankowsky et al. |
| 2003/0035312 A1 | 2/2003 | Halbert et al. |
| 2003/0039158 A1 | 2/2003 | Horiguchi et al. |
| 2003/0041295 A1 | 2/2003 | Hou et al. |
| 2003/0061458 A1 | 3/2003 | Wilcox et al. |
| 2003/0061459 A1 | 3/2003 | Aboulenein et al. |
| 2003/0083855 A1 | 5/2003 | Fukuyama |
| 2003/0088743 A1 | 5/2003 | Rader |
| 2003/0093614 A1 | 5/2003 | Kohn et al. |
| 2003/0101392 A1 | 5/2003 | Lee |
| 2003/0105932 A1 | 6/2003 | David et al. |
| 2003/0110339 A1 | 6/2003 | Calvignac et al. |
| 2003/0117875 A1 | 6/2003 | Lee et al. |
| 2003/0123389 A1 | 7/2003 | Russell et al. |
| 2003/0126338 A1 | 7/2003 | Dodd et al. |
| 2003/0127737 A1 | 7/2003 | Takahashi |
| 2003/0131160 A1 | 7/2003 | Hampel et al. |
| 2003/0145163 A1 | 7/2003 | Seo et al. |
| 2003/0158995 A1 | 8/2003 | Lee et al. |
| 2003/0164539 A1 | 9/2003 | Yau |
| 2003/0164543 A1 | 9/2003 | Kheng Lee |
| 2003/0174569 A1 | 9/2003 | Amidi |
| 2003/0182513 A1 | 9/2003 | Dodd et al. |
| 2003/0183934 A1 | 10/2003 | Barrett |
| 2003/0189868 A1 | 10/2003 | Riesenman et al. |
| 2003/0189870 A1 | 10/2003 | Wilcox |
| 2003/0191888 A1 | 10/2003 | Klein |
| 2003/0191915 A1 | 10/2003 | Saxena et al. |
| 2003/0200382 A1 | 10/2003 | Wells et al. |
| 2003/0200474 A1 | 10/2003 | Li |
| 2003/0205802 A1 | 11/2003 | Segaram et al. |
| 2003/0206476 A1 | 11/2003 | Joo |
| 2003/0217303 A1 | 11/2003 | Chua-Eoan et al. |
| 2003/0223290 A1 | 12/2003 | Park et al. |
| 2003/0227798 A1 | 12/2003 | Pax |
| 2003/0229821 A1 | 12/2003 | Ma |
| 2003/0230801 A1 | 12/2003 | Jiang et al. |
| 2003/0231540 A1 | 12/2003 | Lazar et al. |
| 2003/0231542 A1 | 12/2003 | Zaharinova-Papazova et al. |
| 2003/0234664 A1 | 12/2003 | Yamagata |
| 2004/0000708 A1 | 1/2004 | Rapport et al. |
| 2004/0016994 A1 | 1/2004 | Huang |
| 2004/0027902 A1 | 2/2004 | Ooishi et al. |

(56) References Cited

U.S. PATENT DOCUMENTS

| | | |
|---|---|---|
| 2004/0034732 A1 | 2/2004 | Valin et al. |
| 2004/0034755 A1 | 2/2004 | LaBerge et al. |
| 2004/0037133 A1 | 2/2004 | Park et al. |
| 2004/0042503 A1 | 3/2004 | Shaeffer et al. |
| 2004/0044808 A1 | 3/2004 | Salmon et al. |
| 2004/0047228 A1 | 3/2004 | Chen |
| 2004/0049624 A1 | 3/2004 | Salmonsen |
| 2004/0057317 A1 | 3/2004 | Schaefer |
| 2004/0064647 A1 | 4/2004 | DeWhitt et al. |
| 2004/0064767 A1 | 4/2004 | Huckaby et al. |
| 2004/0083324 A1 | 4/2004 | Rabinovitz et al. |
| 2004/0088475 A1 | 5/2004 | Streif et al. |
| 2004/0100837 A1 | 5/2004 | Lee |
| 2004/0117723 A1 | 6/2004 | Foss |
| 2004/0123173 A1 | 6/2004 | Emberling et al. |
| 2004/0125635 A1 | 7/2004 | Kuzmenka |
| 2004/0133374 A1 | 7/2004 | Kattan |
| 2004/0133375 A1* | 7/2004 | Kattan ........................... 702/89 |
| 2004/0133736 A1 | 7/2004 | Kyung |
| 2004/0139359 A1 | 7/2004 | Samson et al. |
| 2004/0145863 A1 | 7/2004 | Byon |
| 2004/0151038 A1 | 8/2004 | Ruckerbauer et al. |
| 2004/0174765 A1 | 9/2004 | Seo et al. |
| 2004/0177079 A1 | 9/2004 | Gluhovsky et al. |
| 2004/0178824 A1 | 9/2004 | Pan |
| 2004/0184324 A1 | 9/2004 | Pax |
| 2004/0186956 A1 | 9/2004 | Perego et al. |
| 2004/0188704 A1 | 9/2004 | Halbert et al. |
| 2004/0195682 A1 | 10/2004 | Kimura |
| 2004/0196732 A1 | 10/2004 | Lee |
| 2004/0205433 A1 | 10/2004 | Gower et al. |
| 2004/0208173 A1 | 10/2004 | Di Gregorio |
| 2004/0225858 A1 | 11/2004 | Brueggen |
| 2004/0228166 A1 | 11/2004 | Braun et al. |
| 2004/0228196 A1 | 11/2004 | Kwak et al. |
| 2004/0228203 A1 | 11/2004 | Koo |
| 2004/0230932 A1 | 11/2004 | Dickmann |
| 2004/0236877 A1 | 11/2004 | Burton |
| 2004/0250989 A1 | 12/2004 | Im et al. |
| 2004/0256638 A1 | 12/2004 | Perego et al. |
| 2004/0257847 A1 | 12/2004 | Matsui et al. |
| 2004/0260957 A1 | 12/2004 | Jeddeloh et al. |
| 2004/0264255 A1 | 12/2004 | Royer |
| 2004/0268161 A1 | 12/2004 | Ross |
| 2005/0018495 A1 | 1/2005 | Bhakta et al. |
| 2005/0021874 A1 | 1/2005 | Georgiou et al. |
| 2005/0024963 A1 | 2/2005 | Jakobs et al. |
| 2005/0027928 A1 | 2/2005 | Avraham et al. |
| 2005/0028038 A1 | 2/2005 | Pomaranski et al. |
| 2005/0034004 A1 | 2/2005 | Bunker et al. |
| 2005/0036350 A1 | 2/2005 | So et al. |
| 2005/0041504 A1 | 2/2005 | Perego et al. |
| 2005/0044302 A1 | 2/2005 | Pauley et al. |
| 2005/0044303 A1 | 2/2005 | Perego et al. |
| 2005/0044305 A1 | 2/2005 | Jakobs et al. |
| 2005/0047192 A1 | 3/2005 | Matsui et al. |
| 2005/0071543 A1 | 3/2005 | Ellis et al. |
| 2005/0078532 A1 | 4/2005 | Ruckerbauer et al. |
| 2005/0081085 A1 | 4/2005 | Ellis et al. |
| 2005/0086548 A1 | 4/2005 | Haid et al. |
| 2005/0099834 A1 | 5/2005 | Funaba et al. |
| 2005/0102590 A1 | 5/2005 | Norris et al. |
| 2005/0105318 A1 | 5/2005 | Funaba et al. |
| 2005/0108460 A1 | 5/2005 | David |
| 2005/0127531 A1 | 6/2005 | Tay et al. |
| 2005/0132158 A1 | 6/2005 | Hampel et al. |
| 2005/0135176 A1 | 6/2005 | Ramakrishnan et al. |
| 2005/0138267 A1 | 6/2005 | Bains et al. |
| 2005/0138304 A1 | 6/2005 | Ramakrishnan et al. |
| 2005/0139977 A1 | 6/2005 | Nishio et al. |
| 2005/0141199 A1 | 6/2005 | Chiou et al. |
| 2005/0149662 A1 | 7/2005 | Perego et al. |
| 2005/0152212 A1 | 7/2005 | Yang et al. |
| 2005/0156934 A1 | 7/2005 | Perego et al. |
| 2005/0166026 A1 | 7/2005 | Ware et al. |
| 2005/0193163 A1 | 9/2005 | Perego et al. |
| 2005/0193183 A1 | 9/2005 | Barth et al. |
| 2005/0194676 A1 | 9/2005 | Fukuda et al. |
| 2005/0194991 A1 | 9/2005 | Dour et al. |
| 2005/0195629 A1 | 9/2005 | Leddige et al. |
| 2005/0201063 A1 | 9/2005 | Lee et al. |
| 2005/0204111 A1 | 9/2005 | Natarajan |
| 2005/0207255 A1 | 9/2005 | Perego et al. |
| 2005/0210196 A1 | 9/2005 | Perego et al. |
| 2005/0223179 A1 | 10/2005 | Perego et al. |
| 2005/0224948 A1 | 10/2005 | Lee et al. |
| 2005/0232049 A1 | 10/2005 | Park |
| 2005/0235119 A1 | 10/2005 | Sechrest et al. |
| 2005/0235131 A1 | 10/2005 | Ware |
| 2005/0237838 A1 | 10/2005 | Kwak et al. |
| 2005/0243635 A1 | 11/2005 | Schaefer |
| 2005/0246558 A1 | 11/2005 | Ku |
| 2005/0249011 A1 | 11/2005 | Maeda |
| 2005/0259504 A1 | 11/2005 | Murtugh et al. |
| 2005/0263312 A1 | 12/2005 | Bolken et al. |
| 2005/0265506 A1 | 12/2005 | Foss et al. |
| 2005/0269715 A1 | 12/2005 | Yoo |
| 2005/0278474 A1 | 12/2005 | Perersen et al. |
| 2005/0281096 A1 | 12/2005 | Bhakta et al. |
| 2005/0281123 A1 | 12/2005 | Bell et al. |
| 2005/0283572 A1 | 12/2005 | Ishihara |
| 2005/0285174 A1 | 12/2005 | Saito et al. |
| 2005/0286334 A1 | 12/2005 | Saito et al. |
| 2005/0289292 A1 | 12/2005 | Morrow et al. |
| 2005/0289317 A1 | 12/2005 | Liou et al. |
| 2006/0002201 A1 | 1/2006 | Janzen |
| 2006/0010339 A1 | 1/2006 | Klein |
| 2006/0026484 A1 | 2/2006 | Hollums |
| 2006/0038597 A1 | 2/2006 | Becker et al. |
| 2006/0039204 A1 | 2/2006 | Cornelius |
| 2006/0039205 A1 | 2/2006 | Cornelius |
| 2006/0041711 A1 | 2/2006 | Miura et al. |
| 2006/0041730 A1 | 2/2006 | Larson |
| 2006/0044909 A1 | 3/2006 | Kinsley et al. |
| 2006/0044913 A1 | 3/2006 | Klein et al. |
| 2006/0049502 A1 | 3/2006 | Goodwin et al. |
| 2006/0050574 A1 | 3/2006 | Streif et al. |
| 2006/0056244 A1 | 3/2006 | Ware |
| 2006/0062047 A1 | 3/2006 | Bhakta et al. |
| 2006/0067141 A1 | 3/2006 | Perego et al. |
| 2006/0085616 A1 | 4/2006 | Zeighami et al. |
| 2006/0087900 A1 | 4/2006 | Bucksch et al. |
| 2006/0090031 A1 | 4/2006 | Kirshenbaum et al. |
| 2006/0090054 A1 | 4/2006 | Choi et al. |
| 2006/0106951 A1 | 5/2006 | Bains |
| 2006/0112214 A1 | 5/2006 | Yeh |
| 2006/0112219 A1 | 5/2006 | Chawla et al. |
| 2006/0117152 A1 | 6/2006 | Amidi et al. |
| 2006/0117160 A1 | 6/2006 | Jackson et al. |
| 2006/0118933 A1 | 6/2006 | Haba |
| 2006/0120193 A1 | 6/2006 | Casper |
| 2006/0123265 A1 | 6/2006 | Ruckerbauer et al. |
| 2006/0126369 A1 | 6/2006 | Raghuram |
| 2006/0129712 A1 | 6/2006 | Raghuram |
| 2006/0129740 A1 | 6/2006 | Ruckerbauer et al. |
| 2006/0129755 A1 | 6/2006 | Raghuram |
| 2006/0133173 A1 | 6/2006 | Jain et al. |
| 2006/0136791 A1 | 6/2006 | Nierle |
| 2006/0149857 A1 | 7/2006 | Holman |
| 2006/0149982 A1 | 7/2006 | Vogt |
| 2006/0174082 A1 | 8/2006 | Bellows et al. |
| 2006/0176744 A1 | 8/2006 | Stave |
| 2006/0179262 A1 | 8/2006 | Brittain et al. |
| 2006/0179333 A1 | 8/2006 | Brittain et al. |
| 2006/0179334 A1 | 8/2006 | Brittain et al. |
| 2006/0180926 A1 | 8/2006 | Mullen et al. |
| 2006/0181953 A1 | 8/2006 | Rotenberg et al. |
| 2006/0195631 A1 | 8/2006 | Rajamani |
| 2006/0198178 A1 | 9/2006 | Kinsley et al. |
| 2006/0203590 A1 | 9/2006 | Mori et al. |
| 2006/0206738 A1 | 9/2006 | Jeddeloh et al. |
| 2006/0233012 A1 | 10/2006 | Sekiguchi et al. |
| 2006/0236165 A1 | 10/2006 | Cepulis et al. |
| 2006/0236201 A1 | 10/2006 | Gower et al. |

(56) References Cited

U.S. PATENT DOCUMENTS

| | | |
|---|---|---|
| 2006/0248261 A1 | 11/2006 | Jacob et al. |
| 2006/0248387 A1 | 11/2006 | Nicholson et al. |
| 2006/0262586 A1 | 11/2006 | Solomon et al. |
| 2006/0262587 A1 | 11/2006 | Matsui et al. |
| 2006/0277355 A1 | 12/2006 | Ellsberry et al. |
| 2006/0294295 A1 | 12/2006 | Fukuzo |
| 2007/0005998 A1 | 1/2007 | Jain et al. |
| 2007/0050530 A1 | 3/2007 | Rajan |
| 2007/0058471 A1 | 3/2007 | Rajan et al. |
| 2007/0070669 A1 | 3/2007 | Tsern |
| 2007/0088995 A1 | 4/2007 | Tsern et al. |
| 2007/0091696 A1 | 4/2007 | Niggemeier et al. |
| 2007/0106860 A1 | 5/2007 | Foster, Sr. et al. |
| 2007/0136537 A1 | 6/2007 | Doblar et al. |
| 2007/0152313 A1 | 7/2007 | Periaman et al. |
| 2007/0162700 A1 | 7/2007 | Fortin et al. |
| 2007/0188997 A1 | 8/2007 | Hockanson et al. |
| 2007/0192563 A1 | 8/2007 | Rajan et al. |
| 2007/0195613 A1 | 8/2007 | Rajan et al. |
| 2007/0204075 A1 | 8/2007 | Rajan et al. |
| 2007/0216445 A1 | 9/2007 | Raghavan et al. |
| 2007/0247194 A1 | 10/2007 | Jain |
| 2007/0279084 A1 | 12/2007 | Oh et al. |
| 2007/0285895 A1 | 12/2007 | Gruendler et al. |
| 2007/0288683 A1 | 12/2007 | Panabaker et al. |
| 2007/0288686 A1 | 12/2007 | Arcedera et al. |
| 2007/0288687 A1 | 12/2007 | Panabaker et al. |
| 2007/0290333 A1 | 12/2007 | Saini et al. |
| 2008/0002447 A1 | 1/2008 | Gulachenski et al. |
| 2008/0010435 A1 | 1/2008 | Smith et al. |
| 2008/0025108 A1 | 1/2008 | Rajan et al. |
| 2008/0025122 A1 | 1/2008 | Schakel et al. |
| 2008/0025136 A1 | 1/2008 | Rajan et al. |
| 2008/0025137 A1 | 1/2008 | Rajan et al. |
| 2008/0027697 A1 | 1/2008 | Rajan et al. |
| 2008/0027702 A1 | 1/2008 | Rajan et al. |
| 2008/0027703 A1 | 1/2008 | Rajan et al. |
| 2008/0028135 A1 | 1/2008 | Rajan et al. |
| 2008/0028136 A1 | 1/2008 | Schakel et al. |
| 2008/0028137 A1 | 1/2008 | Schakel et al. |
| 2008/0031030 A1 | 2/2008 | Rajan et al. |
| 2008/0031072 A1 | 2/2008 | Rajan et al. |
| 2008/0034130 A1 | 2/2008 | Perego et al. |
| 2008/0037353 A1 | 2/2008 | Rajan et al. |
| 2008/0056014 A1 | 3/2008 | Rajan et al. |
| 2008/0062773 A1 | 3/2008 | Rajan et al. |
| 2008/0065820 A1 | 3/2008 | Gillingham et al. |
| 2008/0082763 A1 | 4/2008 | Rajan et al. |
| 2008/0086588 A1 | 4/2008 | Danilak et al. |
| 2008/0089034 A1 | 4/2008 | Hoss et al. |
| 2008/0098277 A1 | 4/2008 | Hazelzet |
| 2008/0103753 A1 | 5/2008 | Rajan et al. |
| 2008/0104314 A1 | 5/2008 | Rajan et al. |
| 2008/0109206 A1 | 5/2008 | Rajan et al. |
| 2008/0109595 A1 | 5/2008 | Rajan et al. |
| 2008/0109597 A1 | 5/2008 | Schakel et al. |
| 2008/0109598 A1 | 5/2008 | Schakel et al. |
| 2008/0115006 A1 | 5/2008 | Smith et al. |
| 2008/0120443 A1 | 5/2008 | Rajan et al. |
| 2008/0120458 A1 | 5/2008 | Gillingham et al. |
| 2008/0123459 A1 | 5/2008 | Rajan et al. |
| 2008/0126624 A1 | 5/2008 | Prete et al. |
| 2008/0126687 A1 | 5/2008 | Rajan et al. |
| 2008/0126688 A1 | 5/2008 | Rajan et al. |
| 2008/0126689 A1 | 5/2008 | Rajan et al. |
| 2008/0126690 A1 | 5/2008 | Rajan et al. |
| 2008/0126692 A1 | 5/2008 | Rajan et al. |
| 2008/0130364 A1 | 6/2008 | Guterman et al. |
| 2008/0133825 A1 | 6/2008 | Rajan et al. |
| 2008/0155136 A1 | 6/2008 | Hishino |
| 2008/0159027 A1 | 7/2008 | Kim |
| 2008/0170425 A1 | 7/2008 | Rajan |
| 2008/0195894 A1 | 8/2008 | Schreck et al. |
| 2008/0215832 A1 | 9/2008 | Allen et al. |
| 2008/0239857 A1 | 10/2008 | Rajan et al. |
| 2008/0239858 A1 | 10/2008 | Rajan et al. |
| 2008/0256282 A1 | 10/2008 | Guo et al. |
| 2008/0282084 A1 | 11/2008 | Hatakeyama |
| 2008/0282341 A1 | 11/2008 | Hatakeyama |
| 2009/0024789 A1 | 1/2009 | Rajan et al. |
| 2009/0024790 A1 | 1/2009 | Rajan et al. |
| 2009/0049266 A1 | 2/2009 | Kuhne |
| 2009/0063865 A1 | 3/2009 | Berenbaum et al. |
| 2009/0063896 A1 | 3/2009 | Lastras-Montano et al. |
| 2009/0070520 A1 | 3/2009 | Mizushima |
| 2009/0089480 A1 | 4/2009 | Wah et al. |
| 2009/0109613 A1 | 4/2009 | Legen et al. |
| 2009/0180926 A1 | 7/2009 | Petruno et al. |
| 2009/0216939 A1 | 8/2009 | Smith et al. |
| 2009/0285031 A1 | 11/2009 | Rajan et al. |
| 2009/0290442 A1 | 11/2009 | Rajan |
| 2010/0005218 A1 | 1/2010 | Gower et al. |
| 2010/0020585 A1 | 1/2010 | Rajan |
| 2010/0257304 A1 | 10/2010 | Rajan et al. |
| 2010/0271888 A1 | 10/2010 | Rajan |
| 2010/0281280 A1 | 11/2010 | Rajan et al. |

FOREIGN PATENT DOCUMENTS

| | | |
|---|---|---|
| DE | 102005036528 | 2/2007 |
| EP | 0132129 | 1/1985 |
| EP | 0644547 | 3/1995 |
| JP | 62121978 | 6/1987 |
| JP | 01171047 | 7/1989 |
| JP | 03-029357 | 2/1991 |
| JP | 03286234 | 12/1991 |
| JP | 2005-298192 | 11/1993 |
| JP | 07-141870 | 6/1995 |
| JP | 08/077097 | 3/1996 |
| JP | 10233091 | 10/1998 |
| JP | 11-149775 | 6/1999 |
| JP | 2002025255 | 1/2002 |
| JP | 3304893 B2 | 5/2002 |
| JP | 2002288037 | 10/2002 |
| JP | 2004-327474 | 11/2004 |
| JP | 2005062914 | 3/2005 |
| JP | 2005108224 | 4/2005 |
| JP | 2006236388 | 9/2006 |
| KR | 1999-0076659 | 10/1999 |
| KR | 1020040062717 | 7/2004 |
| KR | 2005120344 | 12/2005 |
| WO | 95/05676 | 2/1995 |
| WO | WO97/25674 | 7/1997 |
| WO | 99/00734 | 1/1999 |
| WO | WO00/45270 | 8/2000 |
| WO | WO01/37090 | 5/2001 |
| WO | 01/90900 | 11/2001 |
| WO | 01/97160 | 12/2001 |
| WO | WO 2004/044754 | 5/2004 |
| WO | WO2004/051645 | 6/2004 |
| WO | WO2006/072040 | 7/2006 |
| WO | 2007/028109 | 3/2007 |
| WO | 2007/038225 | 4/2007 |
| WO | 2007/095080 | 8/2007 |
| WO | 2008/063251 | 5/2008 |

OTHER PUBLICATIONS

Notice of Allowance from U.S. Appl. No. 13/620,424, Dated Sep. 11, 2013.
Non-Final Office Action from U.S. Appl. No. 13/620,291, Dated Sep. 12, 2013.
Notice of Allowance from U.S. Appl. No. 13/341,844, Dated Sep. 17, 2013.
Notice of Allowance from U.S. Appl. No. 13/620,412, dated Sep. 25, 2013.
Non-Final Office Action from U.S. Appl. No. 13/343,852, dated Sep. 27, 2013.
English Translation of Office Action from co-pending Korean patent application No. 10-2008-7019582, dated Sep. 16, 2013.
Notice of Allowance from U.S. Appl. No. 13/620,565, dated Sep. 27, 2013.

(56) References Cited

OTHER PUBLICATIONS

Non-Final Office Action from U.S. Appl. No. 13/279,068, dated Sep. 30, 2013.
Notice of Allowance from U.S. Appl. No. 13/620,207, dated Oct. 9, 2013.
Non-Final Office Action from U.S. Appl. No. 13/898,002, dated Oct. 10, 2013.
Notice of Allowance from U.S. Appl. No. 13/471,283, dated Oct. 15, 2013.
Notice of Allowance from U.S. Appl. No. 11/515,223, dated Oct. 24, 2013.
Notice of Allowance from U.S. Appl. No. 13/181,747, dated Oct. 28, 2013.
Notice of Allowance from U.S. Appl. No. 13/597,895, dated Oct. 29, 2013.
Notice of Allowance from U.S. Appl. No. 13/620,199, dated Nov. 13, 2013.
Final Office Action from U.S. Appl. No. 13/620,793, dated Nov. 13, 2013.
Notice of Allowance from U.S. Appl. No. 13/618,246, dated Nov. 14, 2013.
Notice of Allowance from U.S. Appl. No. 13/473,827, dated Nov. 20, 2013.
"BIOS and Kernel Developer's Guide (BKDG) for AMD Family 10h Processors," AMD, 31116 Rev 3.00, Sep. 7, 2007.
Buffer Device for Memory Modules (DIMM), IP.com Prior Art Database, <URL: http://ip.com/IPCOM/000144850>, Feb. 10, 2007, 1 pg.
Final Office Action from U.S. Appl. No. 11/929,571 Dated Mar. 3, 2011.
Final Office Action from U.S. Appl. No. 11/461,420 Dated Jul. 20, 2011.
Final Office Action from U.S. Appl. No. 11/461,420 Mailed Apr. 28, 2010.
Final Office Action from U.S. Appl. No. 11/461,430 mailed on Sep. 8, 2008.
Final Office Action from U.S. Appl. No. 11/461,435 Dated May 13, 2010.
Final Office Action from U.S. Appl. No. 11/461,435 mailed on Jan. 28, 2009.
Final Office Action from U.S. Appl. No. 11/461,435 Mailed Jan. 28, 2009.
Final Office Action from U.S. Appl. No. 11/515,167 Dated Jun. 3, 2010.
Final Office Action from U.S. Appl. No. 11/553,390 Dated Jun. 24, 2010.
Final Office Action from U.S. Appl. No. 11/588,739 Dated Dec. 15, 2010.
Final Office Action from U.S. Appl. No. 11/672,921 Dated Jul. 23, 2010.
Final Office Action from U.S. Appl. No. 11/672,924 Dated Sep. 7, 2010.
Final Office Action from U.S. Appl. No. 11/702,960 Dated Jun. 21, 2010.
Final Office Action from U.S. Appl. No. 11/828,182 Dated Dec. 22, 2010.
Final Office Action from U.S. Appl. No. 11/855,805, Dated May 26, 2011.
Final Office Action from U.S. Appl. No. 11/858,518 Mailed Apr. 21, 2010.
Final Office Action from U.S. Appl. No. 11/929,225 Dated Aug. 27, 2010.
Final Office Action from U.S. Appl. No. 11/929,261 Dated Sep. 7, 2010.
Final Office Action from U.S. Appl. No. 11/929,286 Dated Aug. 20, 2010.
Final Office Action from U.S. Appl. No. 11/929,403 Dated Aug. 31, 2010.
Final Office Action from U.S. Appl. No. 11/929,417 Dated Aug. 31, 2010.
Final Office Action from U.S. Appl. No. 11/929,432 Dated Aug. 20, 2010.
Final Office Action from U.S. Appl. No. 11/929,450 Dated Aug. 20, 2010.
Final Office Action from U.S. Appl. No. 11/929,500 Dated Jun. 24, 2010.
Final Office Action from U.S. Appl. No. 11/929,631 Dated Nov. 18, 2010.
Final Office Action from U.S. Appl. No. 11/929,655 Dated Nov. 22, 2010.
Final Office Action from U.S. Appl. No. 11/939,440 Dated May 19, 2011.
Final Office Action from U.S. Appl. No. 12/057,306 Dated Jun. 15, 2011.
Final Office Action from U.S. Appl. No. 12/507,682 Dated Mar. 29, 2011.
Final Office Action from U.S. Appl. No. 12/574,628 Dated Mar. 3, 2011.
Final Office Action from U.S. Appl. No. 12/769,428 Dated Jun. 16, 2011.
Final Rejection From U.S. Appl. No. 11/461,437 Mailed Nov. 10, 2009.
Final Rejection from U.S. Appl. No. 11/762,010 Mailed Dec. 4, 2009.
German Office Action From German Patent Application No. 11 2006 001 810.8-55 Mailed Apr. 20, 2009 (With Translation).
German Office Action from German Patent Application No. 11 2006 002 300.4-55 Dated May 11, 2009 (With Translation).
German Office Action from German Patent Application No. 11 2006 002 300.4-55 Mailed Jun. 5, 2009 (with Translation).
Great Britain Office Action from GB Patent Application No. GB0800734.6 Mailed Mar. 1, 2010.
Great Britain Office Action from GB Patent Application No. GB0803913.3 Mailed Mar. 1, 2010.
International Preliminary Examination Report From PCT Application No. PCT/US07/016385 Dated Feb. 3, 2009.
Non-final Office Action from U.S. Appl. No. 11/461,430 mailed on Feb. 19, 2009.
Non-final Office Action from U.S. Appl. No. 11/461,437 mailed on Jan. 26, 2009.
Non-final Office Action from U.S. Appl. No. 11/939,432 mailed on Feb. 6, 2009.
Non-Final Office Action from U.S. Appl. No. 11/461,420 Dated Jul. 23, 2009.
Non-Final Office Action from U.S. Appl. No. 11/461,430 Mailed Feb. 19, 2009.
Non-Final Office Action from U.S. Appl. No. 11/461,435 Dated Aug. 5, 2009.
Non-Final Office Action from U.S. Appl. No. 11/461,437 Mailed Jan. 26, 2009.
Non-Final Office Action from U.S. Appl. No. 11/461,441 Mailed Apr. 2, 2009.
Non-Final Office Action from U.S. Appl. No. 11/515,167 Dated Sep. 25, 2009.
Non-Final Office Action from U.S. Appl. No. 11/515,223 Dated Sep. 22, 2009.
Non-Final Office Action from U.S. Appl. No. 11/538,041 Dated Jun. 10, 2009.
Non-Final Office Action from U.S. Appl. No. 11/553,372 Dated Jun. 25, 2009.
Non-Final Office Action from U.S. Appl. No. 11/553,372 Dated Jan. 5, 2011.
Non-Final Office Action from U.S. Appl. No. 11/553,390 Dated Sep. 9, 2009.
Non-Final Office Action from U.S. Appl. No. 11/553,399 Dated Jul. 7, 2009.
Non-Final Office Action from U.S. Appl. No. 11/588,739 Mailed Dec. 29, 2009.
Non-Final Office Action from U.S. Appl. No. 11/611,374 Mailed Mar. 23, 2009.
Non-Final Office Action from U.S. Appl. No. 11/672,921 Dated May 27, 2011.
Non-Final Office Action from U.S. Appl. No. 11/672,924 Dated Jun. 8, 2011.

(56) References Cited

OTHER PUBLICATIONS

Non-Final Office Action from U.S. Appl. No. 11/702,960 Dated Sep. 25, 2009.
Non-Final Office Action from U.S. Appl. No. 11/702,960 Dated Jun. 23, 2011.
Non-Final Office Action from U.S. Appl. No. 11/702,981 Dated Aug. 19, 2009.
Non-Final Office Action from U.S. Appl. No. 11/702,981 Dated Mar. 11, 2009.
Non-Final Office Action from U.S. Appl. No. 11/762,010 Mailed Mar. 20, 2009.
Non-Final Office Action from U.S. Appl. No. 11/762,013 Dated Jun. 5, 2009.
Non-Final Office Action from U.S. Appl. No. 11/763,365 Dated Oct. 28, 2009.
Non-Final Office Action from U.S. Appl. No. 11/828,181 Dated Jun. 27, 2011.
Non-Final Office Action from U.S. Appl. No. 11/828,181 Mailed Mar. 2, 2010.
Non-Final Office Action from U.S. Appl. No. 11/828,182 Dated Jun. 27, 2011.
Non-Final Office Action from U.S. Appl. No. 11/828,182 Mailed Mar. 29, 2010.
Non-Final Office Action from U.S. Appl. No. 11/855,805 Dated Sep. 21, 2010.
Non-Final Office Action from U.S. Appl. No. 11/855,826 Dated Jan. 13, 2011.
Non-Final Office Action from U.S. Appl. No. 11/858,518 Dated Aug. 14, 2009.
Non-Final Office Action from U.S. Appl. No. 11/858,518 Dated Sep. 8, 2010.
Non-Final Office Action from U.S. Appl. No. 11/858,518 Dated Sep. 27, 2011.
Non-Final Office Action from U.S. Appl. No. 11/929,225 Dated Jun. 8, 2011.
Non-Final Office Action from U.S. Appl. No. 11/929,403 Dated Mar. 31, 2011.
Non-Final Office Action from U.S. Appl. No. 11/929,417 Dated Mar. 31, 2011.
Non-Final Office Action from U.S. Appl. No. 11/929,432 Mailed Jan. 14, 2010.
Non-Final Office Action from U.S. Appl. No. 11/929,500 Dated Oct. 13, 2009.
Non-Final Office Action from U.S. Appl. No. 11/929,571 Mailed Mar. 3, 2010.
Non-Final Office Action from U.S. Appl. No. 11/929,631 Mailed Mar. 3, 2010.
Non-Final Office Action from U.S. Appl. No. 11/929,636 Mailed Mar. 9, 2010.
Non-Final Office Action from U.S. Appl. No. 11/929,655 Dated Jun. 24, 2011.
Non-Final Office Action from U.S. Appl. No. 11/929,655 Mailed Mar. 3, 2010.
Non-Final Office Action from U.S. Appl. No. 11/939,432 Mailed Apr. 12, 2010.
Non-Final Office Action from U.S. Appl. No. 11/939,432 Mailed Feb. 6, 2009.
Non-Final Office Action from U.S. Appl. No. 11/939,440 Dated Sep. 17, 2010.
Non-Final Office Action from U.S. Appl. No. 11/941,589 Dated Oct. 1, 2009.
Non-Final Office Action from U.S. Appl. No. 12/057,306 Dated Oct. 8, 2010.
Non-Final Office Action from U.S. Appl. No. 12/111,819 Mailed Apr. 27, 2009.
Non-Final Office Action from U.S. Appl. No. 12/111,828 Mailed Apr. 17, 2009.
Non-Final Office Action from U.S. Appl. No. 12/203,100 Dated Dec. 1, 2010.
Non-Final Office Action from U.S. Appl. No. 12/378,328 Dated Jul. 15, 2011.
Non-Final Office Action from U.S. Appl. No. 12/507,682 Mailed Mar. 8, 2010.
Non-Final Office Action from U.S. Appl. No. 12/574,628 Dated Sep. 20, 2011.
Non-Final Office Action from U.S. Appl. No. 12/769,428 Dated Nov. 8, 2010.
Non-Final Office Action from U.S. Appl. No. 12/797,557 Dated Jun. 21, 2011.
Non-Final Office Action from U.S. Appl. No. 12/816,756 Dated Feb. 7, 2011.
Non-Final Office Action from U.S. Appl. No. 12/838,896 Dated Sep. 3, 2010.
Non-Final Rejection from U.S. Appl. No. 11/672,921 Mailed Dec. 8, 2009.
Non-Final Rejection from U.S. Appl. No. 11/672,924 Mailed Dec. 14, 2009.
Non-Final Rejection from U.S. Appl. No. 11/929,225 Mailed Dec. 14, 2009.
Non-Final Rejection from U.S. Appl. No. 11/929,261 Mailed Dec. 14, 2009.
Notice of Allowability from U.S. Appl. No. 11/855,826 Dated Aug. 15, 2011.
Notice of Allowance from U.S. Appl. No. 11/461,430 Dated Sep. 10, 2009.
Notice of Allowance from U.S. Appl. No. 11/461,437 Dated Jul. 25, 2011.
Notice of Allowance from U.S. Appl. No. 11/474,075 mailed on Nov. 26, 2008.
Notice of Allowance from U.S. Appl. No. 11/515,223 Dated Feb. 4, 2011.
Notice of Allowance from U.S. Appl. No. 11/553,372 Dated Sep. 30, 2009.
Notice of Allowance from U.S. Appl. No. 11/553,372 Dated Aug. 4, 2010.
Notice of Allowance from U.S. Appl. No. 11/553,399 Dated Oct. 13, 2009.
Notice of Allowance from U.S. Appl. No. 11/553,399 Dated Dec. 3, 2010.
Notice of Allowance from U.S. Appl. No. 11/553,399 Dated Mar. 18, 2011.
Notice of Allowance from U.S. Appl. No. 11/611,374 Dated Sep. 15, 2009.
Notice of Allowance from U.S. Appl. No. 11/611,374 Dated Oct. 29, 2010.
Notice of Allowance from U.S. Appl. No. 11/611,374 Dated Mar. 4, 2011.
Notice of Allowance from U.S. Appl. No. 11/611,374 Dated Jun. 24, 2011.
Notice of Allowance From U.S. Appl. No. 11/611,374 Mailed Nov. 30, 2009.
Notice of Allowance from U.S. Appl. No. 11/702,981 Dated Apr. 25, 2011.
Notice of Allowance from U.S. Appl. No. 11/702,981 Dated Aug. 5, 2011.
Notice of Allowance from U.S. Appl. No. 11/762,010 Dated Oct. 22, 2010.
Notice of Allowance from U.S. Appl. No. 11/762,010 Dated Feb. 18, 2011.
Notice of Allowance from U.S. Appl. No. 11/762,010 Dated Jun. 8, 2011.
Notice of Allowance from U.S. Appl. No. 11/762,013 Dated Aug. 17, 2010.
Notice of Allowance from U.S. Appl. No. 11/762,013 Dated Dec. 7, 2010.
Notice of Allowance from U.S. Appl. No. 11/762,013 Dated Feb. 22, 2011.
Notice of Allowance from U.S. Appl. No. 11/762,013 Dated Jun. 20, 2011.
Notice of Allowance from U.S. Appl. No. 11/763,365 Dated Oct. 20, 2010.

(56) References Cited

OTHER PUBLICATIONS

Notice of Allowance from U.S. Appl. No. 11/763,365 Dated Mar. 1, 2011.
Notice of Allowance from U.S. Appl. No. 11/763,365 Dated Jun. 24, 2011.
Notice of Allowance from U.S. Appl. No. 11/929,320 Dated Sep. 29, 2010.
Notice of Allowance from U.S. Appl. No. 11/929,320 Dated May 5, 2011.
Notice of Allowance from U.S. Appl. No. 11/929,483 Dated Oct. 7, 2010.
Notice of Allowance from U.S. Appl. No. 11/929,483 Dated Mar. 4, 2011.
Notice of Allowance from U.S. Appl. No. 11/929,483 Dated Jun. 23, 2011.
Notice of Allowance from U.S. Appl. No. 11/929,500 Dated Feb. 24, 2011.
Notice of Allowance from U.S. Appl. No. 11/929,500 Dated Jun. 13, 2011.
Notice of Allowance from U.S. Appl. No. 11/929,500 Dated Sep. 27, 2011.
Notice of Allowance from U.S. Appl. No. 11/929,571 Dated Sep. 27, 2011.
Notice of Allowance from U.S. Appl. No. 11/939,432 Dated Sep. 24, 2009.
Notice of Allowance from U.S. Appl. No. 11/939,432 Dated Feb. 18, 2011.
Notice of Allowance From U.S. Appl. No. 11/939,432 Mailed Dec. 1, 2009.
Notice of Allowance from U.S. Appl. No. 11/941,589 Dated Oct. 25, 2010.
Notice of Allowance from U.S. Appl. No. 11/941,589 Dated Jun. 15, 2011.
Notice of Allowance from U.S. Appl. No. 11/941,589 Dated Sep. 30, 2011.
Notice of Allowance From U.S. Appl. No. 12/111,819 Mailed Nov. 20, 2009.
Notice of Allowance From U.S. Appl. No. 12/111,828 Mailed Dec. 15, 2009.
Notice of Allowance from U.S. Appl. No. 12/144,396 Dated Feb. 1, 2011.
Notice of Allowance from U.S. Appl. No. 12/203,100 Dated Jun. 17, 2011.
Notice of Allowance from U.S. Appl. No. 12/816,756 Dated Oct. 3, 2011.
Notice of Allowance from U.S. Appl. No. 12/838,896 Dated Apr. 19, 2011.
Office Action from U.S. Appl. No. 11/461,427 mailed on Sep. 5, 2008.
Office Action from U.S. Appl. No. 11/474,076 mailed on Nov. 3, 2008.
Office Action from U.S. Appl. No. 11/524,811 mailed on Sep. 17, 2008.
Office Action from U.S. Appl. No. 12/574,628 Dated Jun. 10, 2010.
Preliminary Report on Patentability from PCT ApplicationNo. PCT/US06/24360 mailed on Jan. 10, 2008.
Search Report and Written Opinion From PCT Application No. PCT/US07/03460 Dated on Feb. 14, 2008.
Search Report from International PCT Application No. PCT/US06/34390 mailed on Nov. 21, 2007.
Search Report From PCT Application No. PCT/US10/038041 Dated Aug. 23, 2010.
Supplemental European Search Report and Search Opinion issued Sep. 21, 2009 in European Application No. 07870726.2, 8 pp.
Written Opinion from International PCT Application No. PCT/US06/34390 mailed on Nov. 21, 2007.
Written Opinion from PCT Application No. PCT/US06/24360 mailed on Jan. 8, 2007.
Fang et al., W. Power Complexity Analysis of Adiabatic SRAM, 6th Int. Conference On ASIC, vol. 1, Oct. 2005, pp. 334-337.
Kellerbauer "Die Schnelle Million," with translation, "The quick million." [online] [Retrieved on Apr. 1, 2008]; Retrieved from the Internet URL: http://et.coremelt.net/html/91/12/276/art.htm; 8 pages.
Notice of Allowance from U.S. Appl. No. 11/515,223 Dated Jul. 30, 2010.
Notice of Allowance from U.S. Appl. No. 11/553,372 Mailed Mar. 12, 2010.
Notice of Allowance from U.S. Appl. No. 11/553,399 Mailed Mar. 22, 2010.
Notice of Allowance from U.S. Appl. No. 11/611,374 Dated Jul. 19, 2010.
Notice of Allowance from U.S. Appl. No. 11/611,374 Mailed Apr. 5, 2010.
Notice of Allowance from U.S. Appl. No. 11/762,010 Dated Jul. 2, 2010.
Notice of Allowance from U.S. Appl. No. 11/763,365 Dated Jun. 29, 2010.
Notice of Allowance from U.S. Appl. No. 12/111,819 Mailed Mar. 10, 2010.
Pavan et al., P. A Complete Model of E2PROM Memory Cells for Circuit Simulations, IEEE Transactions on Computer-Aided Design of Integrated Circuits and Systems, vol. 22, No. 8, Aug. 2003, pp. 1072-1079.
Skerlj et al., "Buffer Device for Memory Modules (DIMM)," Qimonda 2006, p. 1.
"Using Two Chip Selects to Enable Quad Rank," IP.com PriorArtDatabase, copyright IP.com, Inc. 2004.
Wu et al., "eNVy: A Non-Volatile, Main Memory Storage System", Rice University, ASPLOS-VI Proceedings—Sixth International Conference on Architectural Support for Programming Languages and Operating Systems, San Jose, California, Oct. 4-7, 1994. SIGARCH Computer Architecture News 22(Special Issue Oct. 1994) pp. 86-97; downloaded Nov. 1994.
Non-Final Office Action from U.S. Appl. No. 12/508,496 Dated Oct. 11, 2011.
Non-Final Office Action from U.S. Appl. No. 11/588,739 Dated Oct. 13, 2011.
Notice of Allowance from U.S. Appl. No. 11/939,432 Dated Oct. 24, 2011.
Non-Final Office Action from U.S. Appl. No. 11/929,631 Dated Nov. 1, 2011.
Non-Final Office Action from U.S. Appl. No. 11/553,372 Dated Nov. 14, 2011.
Notice of Allowance from U.S. Appl. No. 11/515,223 Dated Nov. 29, 2011.
Notice of Allowance from U.S. Appl. No. 12/769,428 Dated Nov. 28, 2011.
Final Office Action from U.S. Appl. No. 11/939,440 Dated Dec. 12, 2011.
Notice of Allowance from U.S. Appl. No. 12/797,557 Dated Dec. 28, 2011.
Office Action, including English translation, from co-pending Japanese application No. 2008-529353, Dated Jan. 10, 2012.
Notice of Allowance from U.S. Appl. No. 12/838,896 Dated Jan. 18, 2012.
Final Office Action from U.S. Appl. No. 11/929,655 Dated Jan. 19, 2012.
Final Office Action from U.S. Appl. No. 12/378,328 Dated Feb. 3, 2012.
Final Office Action from U.S. Appl. No. 11/672,921 Dated Feb. 16, 2012.
Final Office Action from U.S. Appl. No. 11/672,924 Dated Feb. 16, 2012.
Final Office Action from U.S. Appl. No. 11/929,225 Dated Feb. 16, 2012.
International Search Report for Application No. EP12150807 Dated Feb. 16, 2012.
Final Office Action from U.S. Appl. No. 11/828,181 Dated Feb. 23, 2012.
Non-Final Office Action from U.S. Appl. No. 11/461,520 Dated Feb. 29, 2012.

(56) References Cited

OTHER PUBLICATIONS

Notice of Allowance from U.S. Appl. No. 12/574,628 Dated Mar. 6, 2012.
Non-Final Office Action from U.S. Appl. No. 13/276,212 Dated Mar. 15, 2012.
Non-Final Office Action from U.S. Appl. No. 13/343,612 Dated Mar. 29, 2012.
Notice of Allowance from U.S. Appl. No. 11/939,440 Dated Mar. 30, 2012.
European Search Report from co-pending European application No. 11194876.6-2212/2450798, Dated Apr. 12, 2012.
European Search Report from co-pending European application No. 11194862.6-2212/2450800, Dated Apr. 12, 2012.
Notice of Allowance from U.S. Appl. No. 11/929,636, Dated Apr. 17, 2012.
Final Office Action from U.S. Appl. No. 11/858,518, Dated Apr. 17, 2012.
European Search Report from co-pending European application No. 11194883.2-2212, Dated Apr. 27, 2012.
Non-Final Office Action from U.S. Appl. No. 11/553,372, Dated May 3, 2012.
Notice of Allowance from U.S. Appl. No. 11/929,631, Dated May 3, 2012.
Non-Final Office Action from U.S. Appl. No. 13/165,713, Dated May 22, 2012.
Non-Final Office Action from U.S. Appl. No. 12/144,396, Dated May 29, 2012.
Non-Final Office Action from U.S. Appl. No. 13/165,713, Dated May 31, 2012.
Non-Final Office Action from U.S. Appl. No. 13/280,251, Dated Jun. 12, 2012.
Final Office Action from U.S. Appl. No. 11/855,805, Dated Jun. 14, 2012.
Office Action, including English translation, from co-pending Japanese application No. 2008-529353, Dated Jul. 31, 2012.
Final Office Action from U.S. Appl. No. 13/315,933, Dated Aug. 24, 2012.
Final Office Action from U.S. Appl. No. 13/276,212, Dated Aug. 30, 2012.
Non-Final Office Action from U.S. Appl. No. 13/367,182, Dated Aug. 31, 2012.
Notice of Allowance from U.S. Appl. No. 11/461,420, Dated Sep. 5, 2012.
Final Office Action from U.S. Appl. No. 13/280,251, Dated Sep. 12, 2012.
Non-Final Office Action from U.S. Appl. No. 11/929,225, Dated Sep. 17, 2012.
Notice of Allowance from U.S. Appl. No. 12/508,496, Dated Sep. 17, 2012.
Non-Final Office Action from U.S. Appl. No. 11/672,921, Dated Oct. 1, 2012.
Notice of Allowance from U.S. Appl. No. 12/057,306, Dated Oct. 10, 2012.
Notice of Allowance from U.S. Appl. No. 12/144,396, Dated Oct. 11, 2012.
Non-Final Office Action from U.S. Appl. No. 13/411,489, Dated Oct. 17, 2012.
Non-Final Office Action from U.S. Appl. No. 13/471,283, Dated Dec. 7, 2012.
English translation of Office Action from co-pending Korean patent application No. KR1020087005172, dated Dec. 20, 2012.
Office Action, including English translation, from co-pending Japanese application No. 2008-529353, Dated Dec. 27, 2012.
Office Action from co-pending European patent application No. EP12150798, Dated Jan. 3, 2013.
Final Office Action from U.S. Appl. No. 11/672,924, Dated Feb. 1, 2013.
Non-Final Office Action from U.S. Appl. No. 13/260,650, Dated Feb. 1, 2013.
Notice of Allowance from U.S. Appl. No. 13/141,844, Dated Feb. 5, 2013.
Notice of Allowance from U.S. Appl. No. 13/473,827, Dated Feb. 15, 2013.
Notice of Allowance from U.S. Appl. No. 12/378,328, Dated Feb. 27, 2013.
Non-Final Office Action from U.S. Appl. No. 13/536,093, Dated Mar. 1, 2013.
Office Action from co-pending Japanese patent application No. 2012-132119, Dated Mar. 6, 2013.
Notice of Allowance from U.S. Appl. No. 11/461,435, Dated Mar. 6, 2013.
English translation of Office Action from co-pending Korean patent application No. KR1020087019582, Dated Mar. 13, 2013.
Notice of Allowance from U.S. Appl. No. 11/515,223, Dated Mar. 18, 2013.
Notice of Allowance from U.S. Appl. No. 13/471,283, Dated Mar. 21, 2013.
Extended European Search Report for co-pending European patent application No. EP12150807.1, dated Feb. 1, 2013, mailed Mar. 22, 2013.
Notice of Allowance from U.S. Appl. No. 13/181,716, Dated Apr. 3, 2013.
Notice of Allowance from U.S. Appl. No. 13/618,246, Dated Apr. 23, 2013.
Notice of Allowance from U.S. Appl. No. 13/182,234, Dated May 1, 2013.
Final Office Action from U.S. Appl. No. 13/315,933, Dated May 3, 2013.
English Translation of Office Action from co-pending Korean patent application No. 10-2013-7004006, Dated Apr. 12, 2013.
Non-Final Office Action from U.S. Appl. No. 13/620,793, Dated May 6, 2013.
Non-Final Office Action from U.S. Appl. No. 13/620,565, Dated May 24, 2013.
Final Office Action from U.S. Appl. No. 11/929,225, Dated May 24, 2013.
Final Office Action from U.S. Appl. No. 11/672,921, Dated May 24, 2013.
Notice of Allowance from U.S. Appl. No. 11/929,631, Dated May 28, 2013.
Notice of Allowance from U.S. Appl. No. 13/620,424, Dated May 29, 2013.
Non-Final Office Action from U.S. Appl. No. 13/455,691, Dated Jun. 4, 2013.
Non-Final Office Action from U.S. Appl. No. 13/620,199, Dated Jun. 17, 2013.
Non-Final Office Action from U.S. Appl. No. 13/620,207, Dated Jun. 20, 2013.
Non-Final Office Action from U.S. Appl. No. 11/828,182, Dated Jun. 20, 2013.
Final Office Action from U.S. Appl. No. 11/828,181, Dated Jun. 20, 2013.
Notice of Allowance from U.S. Appl. No. 13/597,895, Dated Jun. 25, 2013.
Non-Final Office Action from U.S. Appl. No. 13/620,645, Dated Jun. 26, 2013.
Notice of Allowance from U.S. Appl. No. 13/471,283, Dated Jun. 28, 2013.
Notice of Allowance from U.S. Appl. No. 13/181,747, Dated Jul. 9, 2013.
Notice of Allowance from U.S. Appl. No. 11/515,223, Dated Jul. 18, 2013.
Notice of Allowance from U.S. Appl. No. 13/182,234, Dated Jul. 22, 2013.
Notice of Allowance from U.S. Appl. No. 13/181,716, Dated Jul. 22, 2013.
Non-Final Office Action from U.S. Appl. No. 13/620,233, Dated Aug. 2, 2013.
Final Office Action from U.S. Appl. No. 13/367,182, Dated Aug. 8, 2013.
Notice of Allowance from U.S. Appl. No. 13/615,008, Dated Aug. 15, 2013.

(56) References Cited

OTHER PUBLICATIONS

Notice of Allowance from U.S. Appl. No. 13/620,425, Dated Aug. 20, 2013.
Non-Final Office Action from U.S. Appl. No. 13/620,601, Dated Aug. 23, 2013.
Non-Final Office Action from U.S. Appl. No. 12/507,683, Dated Aug. 27, 2013.
Non-Final Office Action from U.S. Appl. No. 13/315,933, Dated Aug. 27, 2013.
Notice of Allowance from U.S. Appl. No. 13/615,008, dated Dec. 3, 2013.
English Translation of Office Action from co-pending Japanese patent application No. P2012-197675, Dec. 3, 2013.
English Translation of Office Action from co-pending Japanese patent application No. P2012-197678, Dec. 3, 2013.
Notice of Allowance from U.S. Appl. No. 13/455,691, dated Dec. 31, 2013.
Non-Final Office Action from U.S. Appl. No. 11/553,390, dated Dec. 31, 2013.
English Translation of Office Action from co-pending Korean patent application No. 10-2013-7004006, dated Dec. 26, 2013.
Search Report from co-pending European Patent Application No. 13191794, dated Dec. 12, 2013.
English Translation of Office Action from co-pending Japanese patent application No. 2012-132119, dated Jan. 7, 2014.
Notice of Allowance from U.S. Appl. No. 13/620,425, dated Jan. 13, 2014.
Office Action from co-pending Korean patent application noumber 10-2013-7029741, dated Dec. 20, 2013.
Notice of Allowance from U.S. Appl. No. 13/279,068, dated Jan. 21, 2014.
Notice of Allowance from U.S. Appl. No. 13/620,412, dated Jan. 21, 2014.
Non-Final Office Action from U.S. Appl. No. 13/367,182, dated Jan. 29, 2014.
Notice of Allowance from U.S. Appl. No. 13/898,002, dated Feb. 3, 2014.
Search Report from co-pending European Patent Application No. 13191796, dated Feb. 10, 2014.
Notice of Allowance from U.S. Appl. No. 13/620,424, dated Feb. 11, 2014.
Notice of Allowance from U.S. Appl. No. 13/620,565, dated Feb. 24, 2014.
Notice of Allowance from U.S. Appl. No. 13/315,933, dated Feb. 26, 2014.
Final Office Action from U.S. Appl. No. 13/620,601, dated Mar. 3, 2014.
Notice of Allowance from U.S. Appl. No. 13/620,207, dated Mar. 6, 2014.
Notice of Allowance from U.S. Appl. No. 13/455,691, dated Mar. 10, 2014.
Notice of Allowance from U.S. Appl. No. 13/620,199, dated Mar. 11, 2014.

* cited by examiner

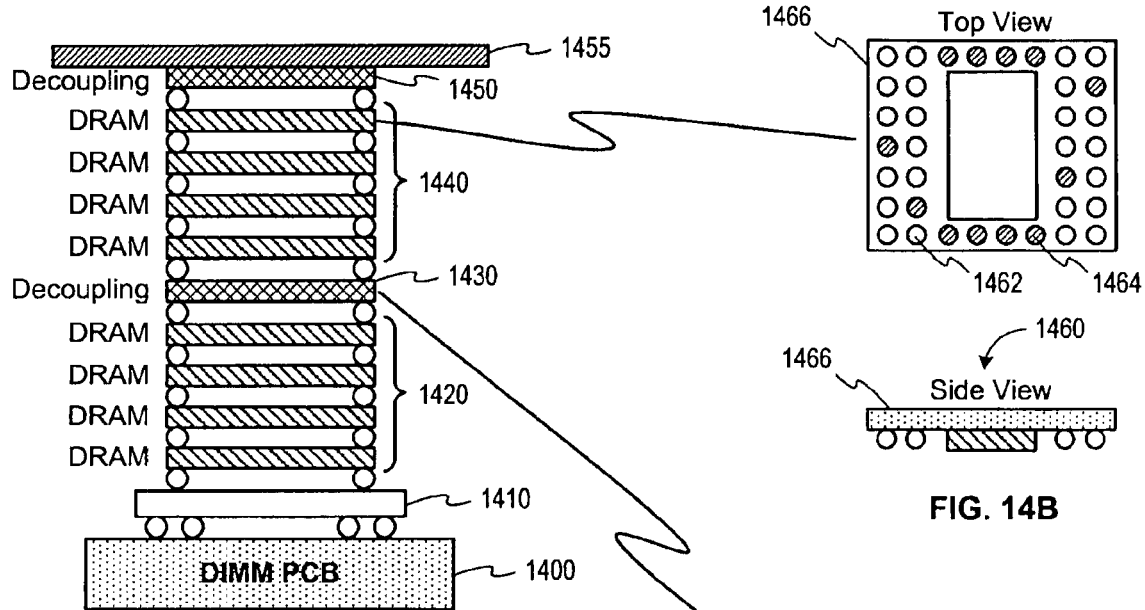
FIG. 14A
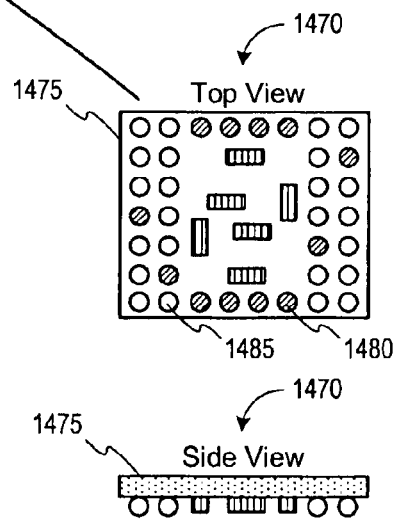
FIG. 14B
FIG. 14C

MEMORY MODULE WITH MEMORY STACK AND INTERFACE WITH ENHANCED CAPABILITES

CROSS-REFERENCES TO RELATED APPLICATIONS

This application is a continuation of U.S. patent application Ser. No. 13/341,844, filed on Dec. 30, 2011, which is a divisional application of U.S. patent application Ser. No. 11/702,981, filed on Feb. 5, 2007, now U.S. Pat. No. 8,089,795, which claims the benefit of U.S. Provisional Patent Application No. 60/865,624, filed on Nov. 13, 2006, and claims the benefit of U.S. Provisional Patent Application No. 60/772,414, filed on Feb. 9, 2006. U.S. patent application Ser. No. 11/702,981 is also a continuation-in-part application of U.S. patent application No. 11/461,437, filed on Jul. 31, 2006, now U.S. Pat. No. 8,077,535. The disclosures of the above-identified patent applications are expressly incorporated herein by reference.

BACKGROUND

1. Field of the Invention

The present invention is directed toward the field of building custom memory systems cost-effectively for a wide range of markets.

2. Art Background

The memory capacity requirements of computers in general, and servers in particular, are increasing at a very rapid pace due to several key trends in the computing industry. The first trend is 64-bit computing, which enables processors to address more than 4 GB of physical memory. The second trend is multi-core CPUs, where each core runs an independent software thread. The third trend is server virtualization or consolidation, which allows multiple operating systems and software applications to run simultaneously on a common hardware platform. The fourth trend is web services, hosted applications, and on-demand software, where complex software applications are centrally run on servers instead of individual copies running on desktop and mobile computers. The intersection of all these trends has created a step function in the memory capacity requirements of servers.

However, the trends in the DRAM industry are not aligned with this step function. As the DRAM interface speeds increase, the number of loads (or ranks) on the traditional multi-drop memory bus decreases in order to facilitate high speed operation of the bus. In addition, the DRAM industry has historically had an exponential relationship between price and DRAM density, such that the highest density ICs or integrated circuits have a higher $/Mb ratio than the mainstream density integrated circuits. These two factors usually place an upper limit on the amount of memory (i.e. the memory capacity) that can be economically put into a server.

One solution to this memory capacity gap is to use a fully buffered DIMM (FB-DIMM), and this is currently being standardized by JEDEC. FIG. 1A illustrates a fully buffered DIMM. As shown in FIG. 1A, memory controller 100 communicates with FB-DIMMs (130 and 140) via advanced memory buffers (AMB) 110 and 120 to operate a plurality of DRAMs. As shown in FIG. 1B, the FB-DIMM approach uses a point-to-point, serial protocol link between the memory controller 100 and FB-DIMMs 150, 151, and 152. In order to read the DRAM devices on, say, the third FB-DIMM 152, the command has to travel through the AMBs on the first FB-DIMM 150 and second FB-DIMM 151 over the serial link segments 141, 142, and 143, and the data from the DRAM devices on the third FB-DIMM 152 must travel back to the memory controller 100 through the AMBs on the first and second FB-DIMMs over serial link segments 144, 145, and 146.

The FB-DIMM approach creates a direct correlation between maximum memory capacity and the printed circuit board (PCB) area. In other words, a larger PCB area is required to provide larger memory capacity. Since most of the growth in the server industry is in the smaller form factor servers like 1U/2U rack servers and blade servers, the FB-DIMM solution does not solve the memory capacity gap for small form factor servers. So, clearly there exists a need for dense memory technology that fits into the mechanical and thermal envelopes of current memory systems.

SUMMARY

A memory module comprises at least one memory stack. The memory stack includes a plurality of DRAM integrated circuits. A buffer circuit, which couples the memory module to a host system, interfaces the memory stack to the host system for transforming one or more physical parameters between the DRAM integrated circuits and the host system. In other embodiments, the buffer circuit interfaces the memory stack to the host system for configuring one or more of the DRAM integrated circuits in the memory stack.

BRIEF DESCRIPTION OF THE DRAWINGS

FIGS. 14A, 14B and 14C illustrate one embodiment of a buffered stack with power decoupling layers.

DETAILED DESCRIPTION

Figure 1A:
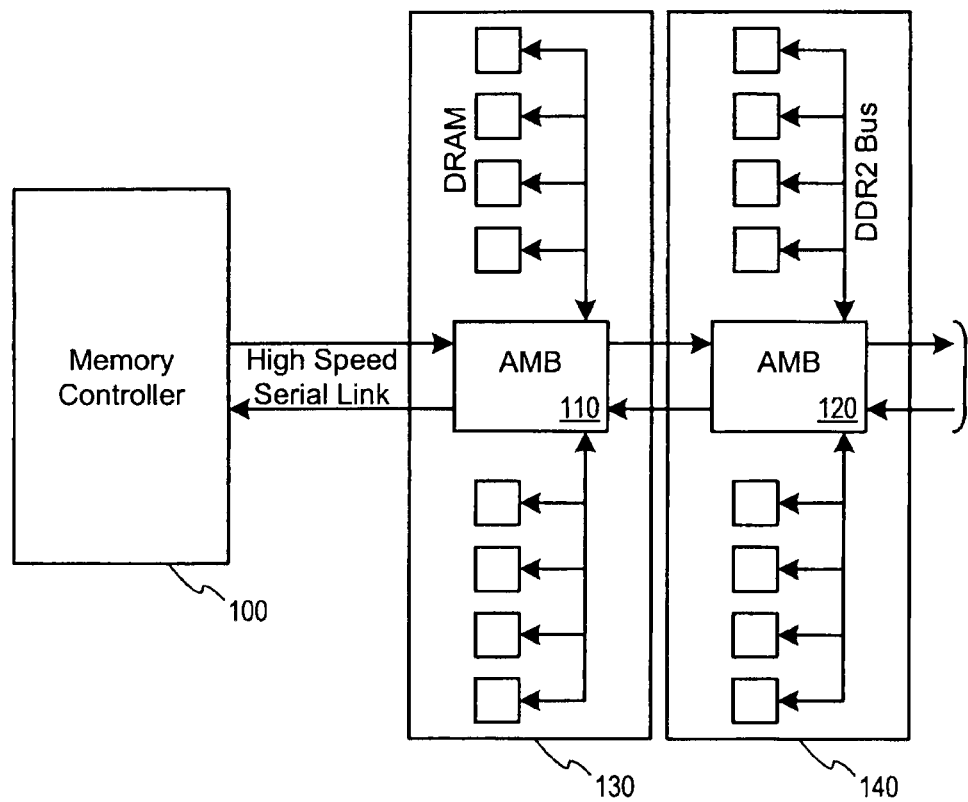
FIGS. 1A-1B illustrate a memory sub-system that uses fully buffered DIMMs.
Figure 1B:
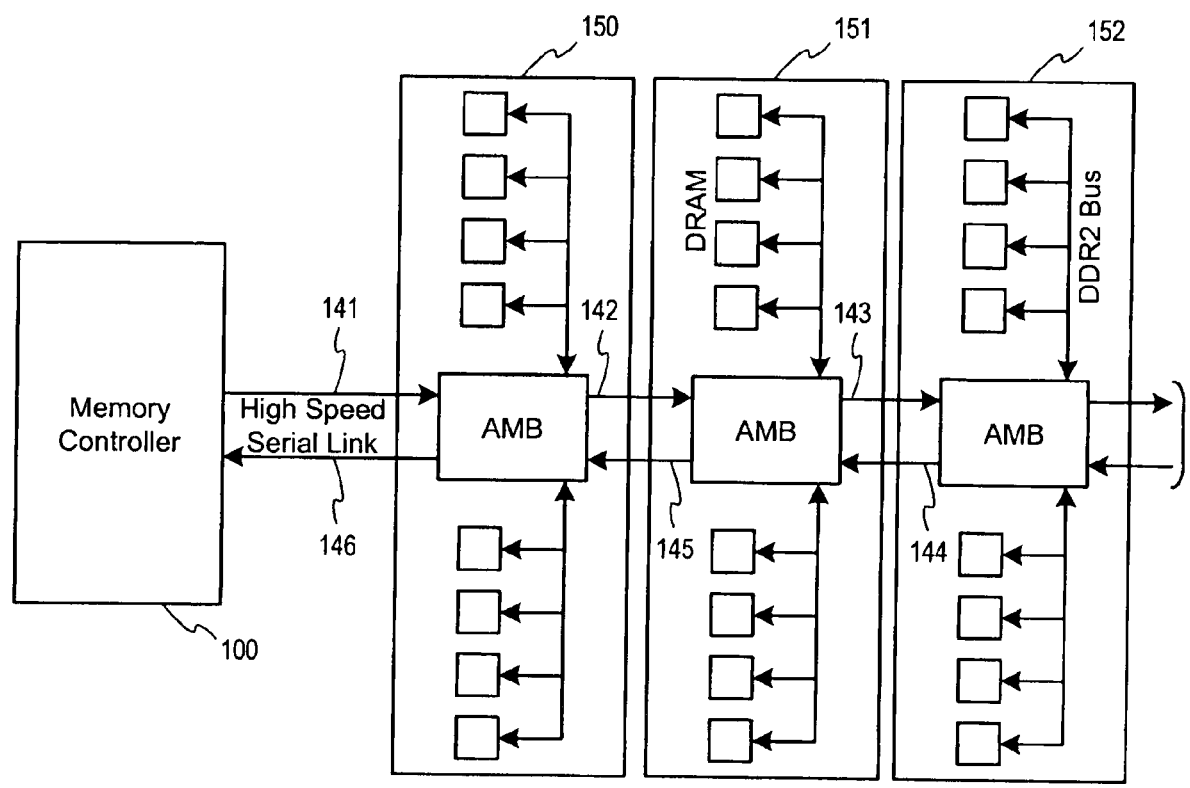
Figure 2A:
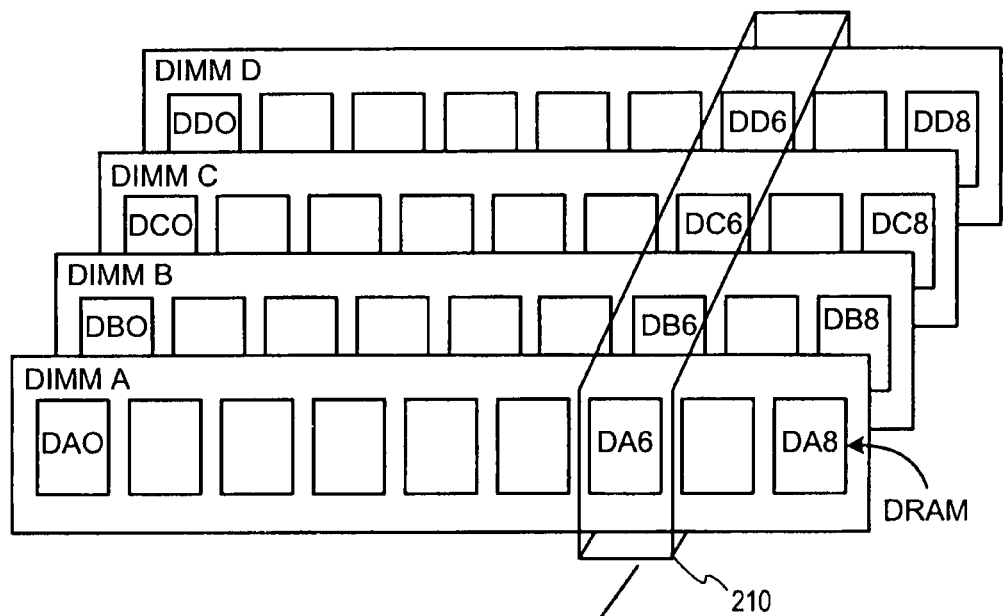
FIGS. 2A-2C illustrate one embodiment of a DIMM with a plurality of DRAM stacks.
Figure 2B:
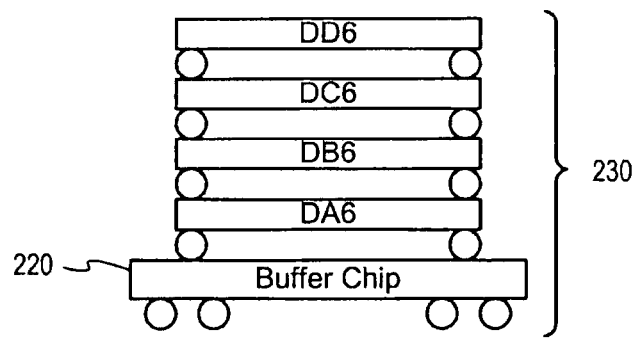
Figure 2C:
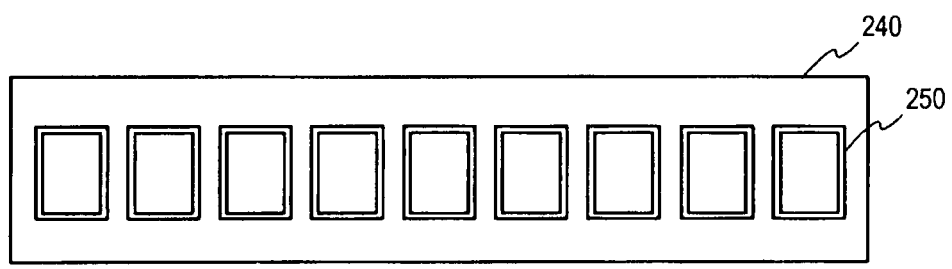

In one embodiment of this invention, multiple buffer integrated circuits are used to buffer the DRAM integrated circuits or devices on a DIMM as opposed to the FB-DIMM approach, where a single buffer integrated circuit is used to buffer all the DRAM integrated circuits on a DIMM. That is, a bit slice approach is used to buffer the DRAM integrated circuits. As an option, multiple DRAMs may be connected to each buffer integrated circuit. In other words, the DRAMs in a slice of multiple DIMMs may be collapsed or coalesced or stacked behind each buffer integrated circuit, such that the buffer integrated circuit is between the stack of DRAMs and the electronic host system. FIGS. 2A-2C illustrate one embodiment of a DIMM with multiple DRAM stacks, where each DRAM stack comprises a bit slice across multiple DIMMs. As an example, FIG. 2A shows four DIMMs (e.g., DIMM A, DIMM B, DIMM C and DIMM D). Also, in this example, there are 9 bit slices labeled DA0, . . . , DA6, . . . DA8 across the four DIMMs. Bit slice "6" is shown encapsulated in block 210. FIG. 2B illustrates a buffered DRAM stack. The buffered DRAM stack 230 comprises a buffer integrated circuit (220) and DRAM devices DA6, DB6, DC6 and DD6. Thus, bit slice 6 is generated from devices DA6, DB6, DC6 and DD6. FIG. 2C is a top view of a high density DIMM with a plurality of buffered DRAM stacks. A high density DIMM (240) comprises buffered DRAM stacks (250) in place of individual DRAMs.

Some exemplary embodiments include:
(a) a configuration with increased DIMM density, that allows the total memory capacity of the system to increase without requiring a larger PCB area. Thus, higher density DIMMs fit within the mechanical and space constraints of current DIMMs.
(b) a configuration with distributed power dissipation, which allows the higher density DIMM to fit within the thermal envelope of existing DIMMs. In an embodiment with multiple buffers on a single DIMM, the power dissipation of the buffering function is spread out across the DIMM.
(c) a configuration with non-cumulative latency to improve system performance. In a configuration with non-cumulative latency, the latency through the buffer integrated circuits on a DIMM is incurred only when that particular DIMM is being accessed.

In a buffered DRAM stack embodiment, the plurality of DRAM devices in a stack are electrically behind the buffer integrated circuit. In other words, the buffer integrated circuit sits electrically between the plurality of DRAM devices in the stack and the host electronic system and buffers some or all of the signals that pass between the stacked DRAM devices and the host system. Since the DRAM devices are standard, off-the-shelf, high speed devices (like DDR SDRAMs or DDR2 SDRAMs), the buffer integrated circuit may have to re-generate some of the signals (e.g. the clocks) while other signals (e.g. data signals) may have to be re-synchronized to the clocks or data strobes to minimize the jitter of these signals. Other signals (e.g. address signals) may be manipulated by logic circuits such as decoders. Some embodiments of the buffer integrated circuit may not re-generate or re-synchronize or logically manipulate some or all of the signals between the DRAM devices and host electronic system.

The buffer integrated circuit and the DRAM devices may be physically arranged in many different ways. In one embodiment, the buffer integrated circuit and the DRAM devices may all be in the same stack. In another embodiment, the buffer integrated circuit may be separate from the stack of DRAM integrated circuits (i.e. buffer integrated circuit may be outside the stack). In yet another embodiment, the DRAM integrated circuits that are electrically behind a buffer integrated circuit may be in multiple stacks (i.e. a buffer integrated circuit may interface with a plurality of stacks of DRAM integrated circuits).

In one embodiment, the buffer integrated circuit can be designed such that the DRAM devices that are electrically behind the buffer integrated circuit appear as a single DRAM integrated circuit to the host system, whose capacity is equal to the combined capacities of all the DRAM devices in the stack. So, for example, if the stack contains eight 512 Mb DRAM integrated circuits, the buffer integrated circuit of this embodiment is designed to make the stack appear as a single 4 Gb DRAM integrated circuit to the host system. An unbuffered DIMM, registered DIMM, S0-DIMM, or FB-DIMM can now be built using buffered stacks of DRAMs instead of individual DRAM devices. For example, a double rank registered DIMM that uses buffered DRAM stacks may have eighteen stacks, nine of which may be on one side of the DIMM PCB and controlled by a first integrated circuit select signal from the host electronic system, and nine may be on the other side of the DIMM PCB and controlled by a second integrated circuit select signal from the host electronic system. Each of these stacks may contain a plurality of DRAM devices and a buffer integrated circuit.

Figure 3A:
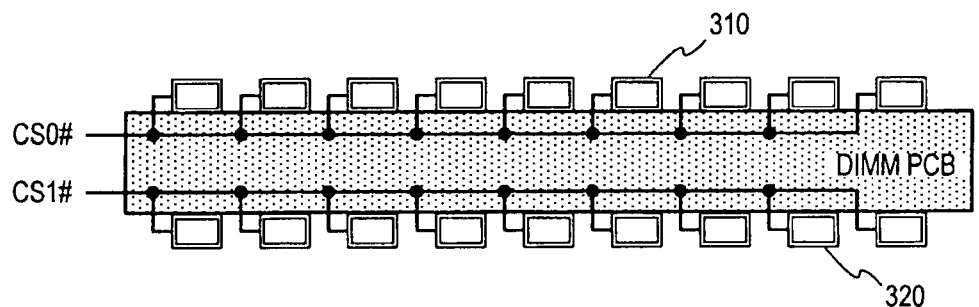
FIG. 3A illustrates a DIMM PCB with buffered DRAM stacks.
Figure 3B:
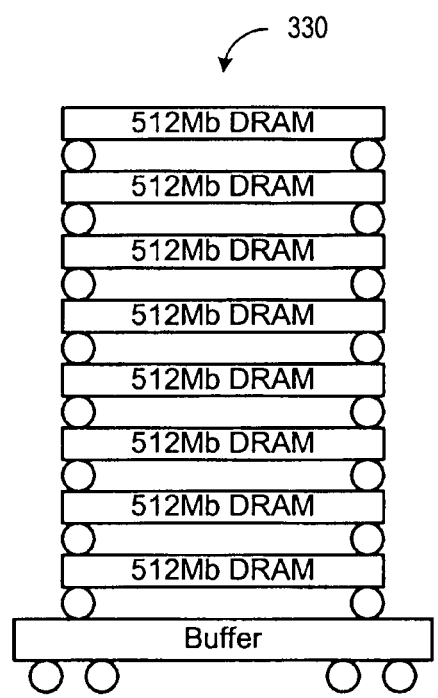
FIG. 3B illustrates a buffered DRAM stack that emulates a 4 Gbyte DRAM.

FIG. 3A illustrates a DIMM PCB with buffered DRAM stacks. As shown in FIG. 3A, both the top and bottom sides of the DIMM PCB comprise a plurality of buffered DRAM stacks (e.g., 310 and 320). Note that the register and clock PLL integrated circuits of a registered DIMM are not shown in this figure for simplicity's sake. FIG. 3B illustrates a buffered DRAM stack that emulates a 4 Gb DRAM.

In one embodiment, a buffered stack of DRAM devices may appear as or emulate a single DRAM device to the host system. In such a case, the number of memory banks that are exposed to the host system may be less than the number of banks that are available in the stack. To illustrate, if the stack contained eight 512 Mb DRAM integrated circuits, the buffer integrated circuit of this embodiment will make the stack look like a single 4 Gb DRAM integrated circuit to the host system. So, even though there are thirty two banks (four banks per 512 Mb integrated circuit*eight integrated circuits) in the stack, the buffer integrated circuit of this embodiment might only expose eight banks to the host system because a 4 Gb DRAM will nominally have only eight banks The eight 512 Mb DRAM integrated circuits in this example may be referred to as physical DRAM devices while the single 4 Gb DRAM integrated circuit may be referred to as a virtual DRAM device. Similarly, the banks of a physical DRAM device may be referred to as a physical bank whereas the bank of a virtual DRAM device may be referred to as a virtual bank.

In another embodiment of this invention, the buffer integrated circuit is designed such that a stack of n DRAM devices appears to the host system as m ranks of DRAM devices (where n≥m, and m≥2). To illustrate, if the stack contained eight 512 Mb DRAM integrated circuits, the buffer integrated circuit of this embodiment may make the stack appear as two ranks of 2 Gb DRAM devices (for the case of m=2), or appear as four ranks of 1 Gb DRAM devices (for the case of m=4), or appear as eight ranks of 512 Mb DRAM devices (for the case of m=8). Consequently, the stack of eight 512 Mb DRAM devices may feature sixteen virtual banks (m=2; eight banks per 2 Gb virtual DRAM*two ranks), or thirty two virtual banks (m=4; eight banks per 1 Gb DRAM*four ranks), or thirty two banks (m=8; four banks per 512 Mb DRAM*eight ranks).

In one embodiment, the number of ranks may be determined by the number of integrated circuit select signals from the host system that are connected to the buffer integrated circuit. For example, the most widely used JEDEC approved pin out of a DIMM connector has two integrated circuit select signals. So, in this embodiment, each stack may be made to appear as two DRAM devices (where each integrated circuit belongs to a different rank) by routing the two integrated circuit select signals from the DIMM connector to each buffer integrated circuit on the DIMM. For the purpose of illustration, let us assume that each stack of DRAM devices has a dedicated buffer integrated circuit, and that the two integrated circuit select signals that are connected on the motherboard to a DIMM connector are labeled CS0# and CS1#. Let us also assume that each stack is 8-bits wide (i.e. has eight data pins), and that the stack contains a buffer integrated circuit and eight 8-bit wide 512 Mb DRAM integrated circuits. In this example, both CS0# and CS1# are connected to all the stacks on the DIMM. So, a single-sided registered DIMM with nine stacks (with CS0# and CS1# connected to all nine stacks) effectively features two 2 GB ranks, where each rank has eight banks.

In another embodiment, a double-sided registered DIMM may be built using eighteen stacks (nine on each side of the PCB), where each stack is 4-bits wide and contains a buffer integrated circuit and eight 4-bit wide 512 Mb DRAM devices. As above, if the two integrated circuit select signals CS0# and CS1# are connected to all the stacks, then this DIMM will effectively feature two 4 GB ranks, where each rank has eight banks. However, half of a rank's capacity is on one side of the DIMM PCB and the other half is on the other side. For example, let us number the stacks on the DIMM as S0 through S17, such that stacks S0 through S8 are on one side of the DIMM PCB while stacks S9 through S17 are on the other side of the PCB. Stack S0 may be connected to the host system's data lines DQ[3:0], stack S9 connected to the host system's data lines DQ[7:4], stack 51 to data lines DQ[11:8], stack S10 to data lines DQ[15:12], and so on. The eight 512 Mb DRAM devices in stack S0 may be labeled as S0_M0 through S0_M7 and the eight 512 Mb DRAM devices in stack S9 may be labeled as S9_M0 through S9_M7. In one example, integrated circuits S0_M0 through S0_M3 may be used by the buffer integrated circuit associated with stack S0 to emulate a 2 Gb DRAM integrated circuit that belongs to the first rank (i.e. controlled by integrated circuit select CS0#). Similarly, integrated circuits S0_M4 through S0_M7 may be used by the buffer integrated circuit associated with stack S0 to emulate a 2 Gb DRAM integrated circuit that belongs to the second rank (i.e. controlled by integrated circuit select CS1#). So, in general, integrated circuits Sn_M0 through Sn_M3 may be used to emulate a 2 Gb DRAM integrated circuit that belongs to the first rank while integrated circuits Sn_M4 through Sn_M7 may be used to emulate a 2 Gb DRAM integrated circuit that belongs to the second rank, where n represents the stack number (i.e. $0 \leq n \leq 17$). It should be noted that the configuration described above is just for illustration. Other configurations may be used to achieve the same result without deviating from the spirit or scope of the claims. For example, integrated circuits S0_M0, S0_M2, S0_M4, and S0_M6 may be grouped together by the associated buffer integrated circuit to emulate a 2 Gb DRAM integrated circuit in the first rank while integrated circuits S0_M1, S0_M3, S0_M5, and S0_M7 may be grouped together by the associated buffer integrated circuit to emulate a 2 Gb DRAM integrated circuit in the second rank of the DIMM.

Figure 4A:
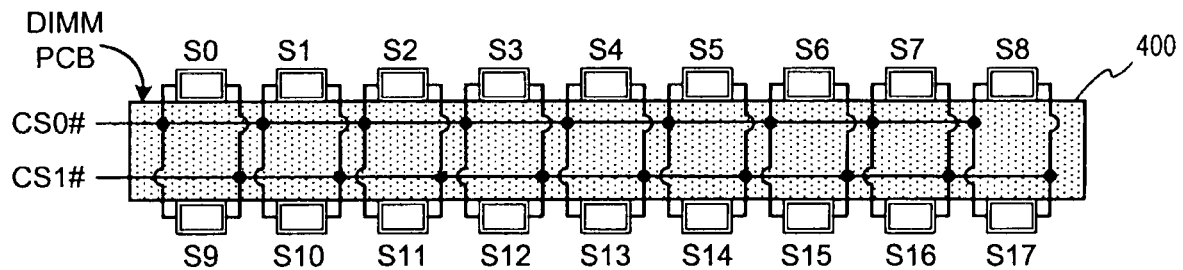
FIG. 4A illustrates an example of a DIMM that uses the buffer integrated circuit and DRAM stack.
Figure 4B:
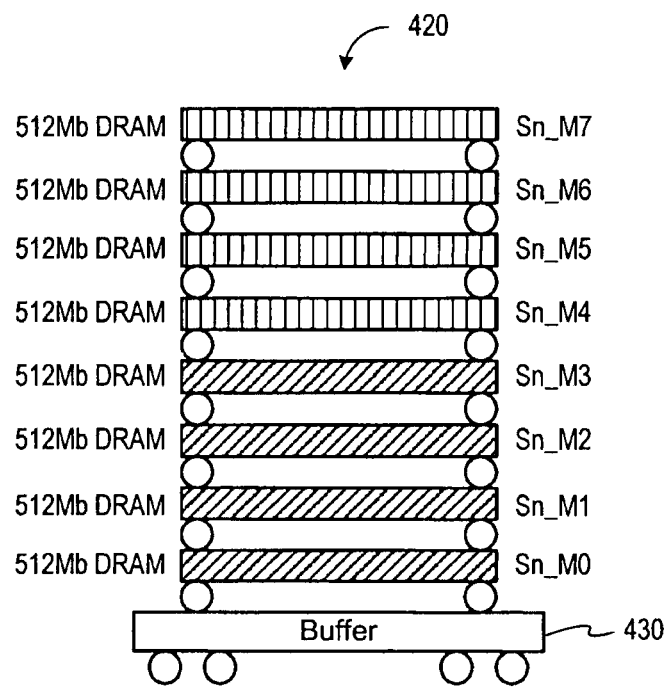
FIG. 4B illustrates a physical stack of DRAMs in accordance with one embodiment.

FIG. 4A illustrates an example of a registered DIMM that uses buffer integrated circuits and DRAM stacks. For simplicity sake, note that the register and clock PLL integrated circuits of a registered DIMM are not shown. The DIMM PCB 400 includes buffered DRAM stacks on the top side of DIMM PCB 400 (e.g., S5) as well as the bottom side of DIMM PCB 400 (e.g., S 15). Each buffered stack emulates two DRAMs. FIG. 4B illustrates a physical stack of DRAM devices in this embodiment. For example, stack 420 comprises eight 4-bit wide, 512 Mb DRAM devices and a buffer integrated circuit 430. As shown in FIG. 4B, a first group of devices, consisting of Sn_M0, Sn_M1, Sn_M2 and Sn_M3, is controlled by CS0#. A second group of devices, which consists of Sn_M4, Sn_M5, Sn_M6 and Sn_M7, is controlled by CS1#. It should be noted that the eight DRAM devices and the buffer integrated circuit are shown as belonging to one stack in FIG. 4B strictly as an example. Other implementations are possible. For example, the buffer integrated circuit 430 may be outside the stack of DRAM devices. Also, the eight DRAM devices may be arranged in multiple stacks.

In an optional variation of the multi-rank embodiment, a single buffer integrated circuit may be associated with a plurality of stacks of DRAM integrated circuits. In the embodiment exemplified in FIGS. 5A and 5B, a buffer integrated circuit is dedicated to two stacks of DRAM integrated circuits. FIG. 5B shows two stacks, one on each side of the DIMM PCB, and one buffer integrated circuit B0 situated on one side of the DIMM PCB. However, this is strictly for the purpose of illustration. The stacks that are associated with a buffer integrated circuit may be on the same side of the DIMM PCB or may be on both sides of the PCB.

Figure 5A:
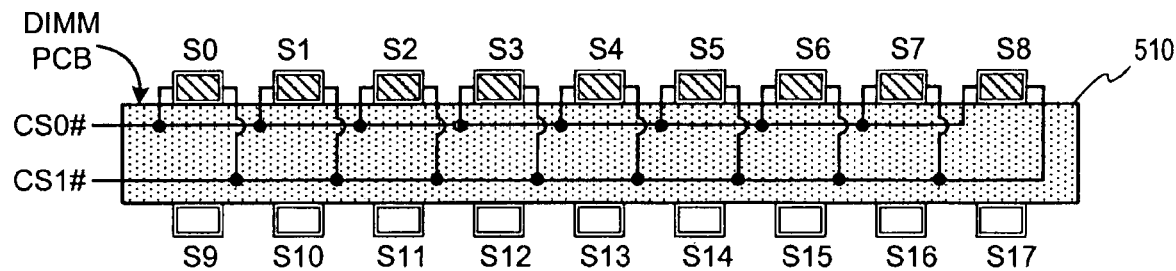
FIGS. 5A and 5B illustrate another embodiment of a multi-rank buffer integrated circuit and DIMM.
Figure 5B:
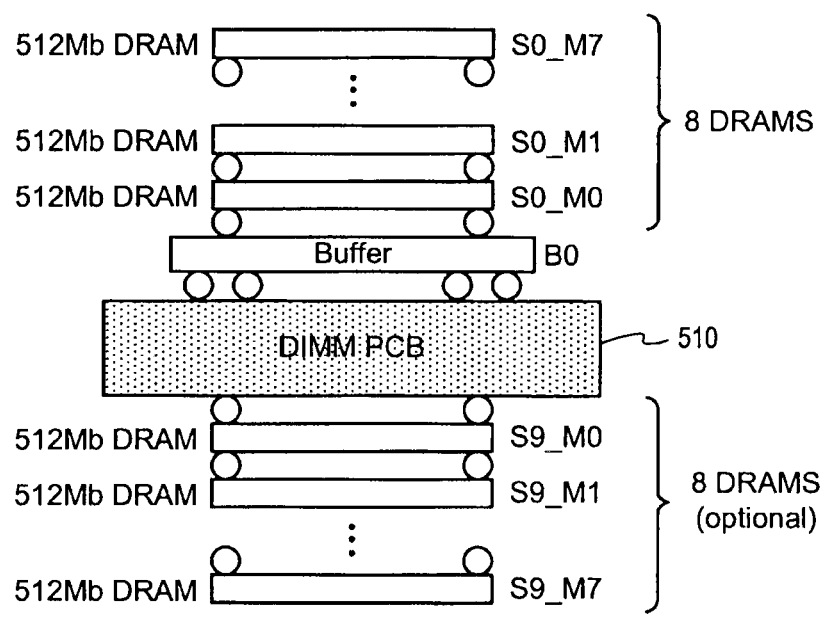

In the embodiment exemplified in FIGS. 5A and 5B, each stack of DRAM devices contains eight 512 Mb integrated circuits, the stacks are numbered S0 through S17, and within each stack, the integrated circuits are labeled Sn_M0 through Sn_M7 (where n is 0 through 17). Also, for this example, the buffer integrated circuit is 8-bits wide, and the buffer integrated circuits are numbered B0 through B8. The two integrated circuit select signals, CS0# and CS1#, are connected to buffer B0 as are the data lines DQ[7:0]. As shown, stacks S0 through S8 are the primary stacks and stacks S9 through S17 are optional stacks. The stack S9 is placed on the other side of the DIMM PCB, directly opposite stack S0 (and buffer B0). The integrated circuits in stack S9 are connected to buffer B0. In other words, the DRAM devices in stacks S0 and S9 are connected to buffer B0, which in turn, is connected to the host system. In the case where the DIMM contains only the primary stacks S0 through S8, the eight DRAM devices in stack S0 are emulated by the buffer integrated circuit B0 to appear to the host system as two 2 Gb devices, one of which is controlled by CS0# and the other is controlled by CS1#. In the case where the DIMM contains both the primary stacks S0 through S8 and the optional stacks S9 through S17, the sixteen 512 Mb DRAM devices in stacks S0 and S9 are together emulated by buffer integrated circuit B0 to appear to the host system as two 4 Gb DRAM devices, one of which is controlled by CS0# and the other is controlled by CS1#.

It should be clear from the above description that this architecture decouples the electrical loading on the memory bus from the number of ranks So, a lower density DIMM can be built with nine stacks (S0 through S8) and nine buffer integrated circuits (B0 through B8), and a higher density DIMM can be built with eighteen stacks (S0 through S17) and nine buffer integrated circuits (B0 through B8). It should be noted that it is not necessary to connect both integrated circuit select signals CS0# and CS1# to each buffer integrated circuit on the DIMM. A single rank lower density DIMM may be built with nine stacks (S0 through S8) and nine buffer integrated circuits (B0 through B8), wherein CS0# is connected to each buffer integrated circuit on the DIMM. Similarly, a single rank higher density DIMM may be built with seventeen stacks (S0 through S17) and nine buffer integrated circuits, wherein CS0# is connected to each buffer integrated circuit on the DIMM.

A DIMM implementing a multi-rank embodiment using a multi-rank buffer is an optional feature for small form factor systems that have a limited number of DIMM slots. For example, consider a processor that has eight integrated circuit select signals, and thus supports up to eight ranks Such a processor may be capable of supporting four dual-rank DIMMs or eight single-rank DIMMs or any other combination that provides eight ranks Assuming that each rank has y banks and that all the ranks are identical, this processor may keep up to 8*y memory pages open at any given time. In some cases, a small form factor server like a blade or 1U server may have physical space for only two DIMM slots per processor. This means that the processor in such a small form factor server may have open a maximum of 4*y memory pages even though the processor is capable of maintaining 8*y pages open. For such systems, a DIMM that contains stacks of DRAM devices and multi-rank buffer integrated circuits may be designed such that the processor maintains 8*y memory pages open even though the number of DIMM slots in the system are fewer than the maximum number of slots that the processor may support. One way to accomplish this, is to apportion all the integrated circuit select signals of the host system across all the DIMM slots on the motherboard. For example, if the processor has only two dedicated DIMM slots, then four integrated circuit select signals may be connected to each DIMM connector. However, if the processor has four dedicated DIMM slots, then two integrated circuit select signals may be connected to each DIMM connector.

To illustrate the buffer and DIMM design, say that a buffer integrated circuit is designed to have up to eight integrated circuit select inputs that are accessible to the host system. Each of these integrated circuit select inputs may have a weak pull-up to a voltage between the logic high and logic low voltage levels of the integrated circuit select signals of the host system. For example, the pull-up resistors may be connected to a voltage (VTT) midway between VDDQ and GND (Ground). These pull-up resistors may be on the DIMM PCB. Depending on the design of the motherboard, two or more integrated circuit select signals from the host system may be connected to the DIMM connector, and hence to the integrated circuit select inputs of the buffer integrated circuit. On power up, the buffer integrated circuit may detect a valid low or high logic level on some of its integrated circuit select inputs and may detect VTT on some other integrated circuit select inputs. The buffer integrated circuit may now configure the DRAMs in the stacks such that the number of ranks in the stacks matches the number of valid integrated circuit select inputs.

Figure 6A:
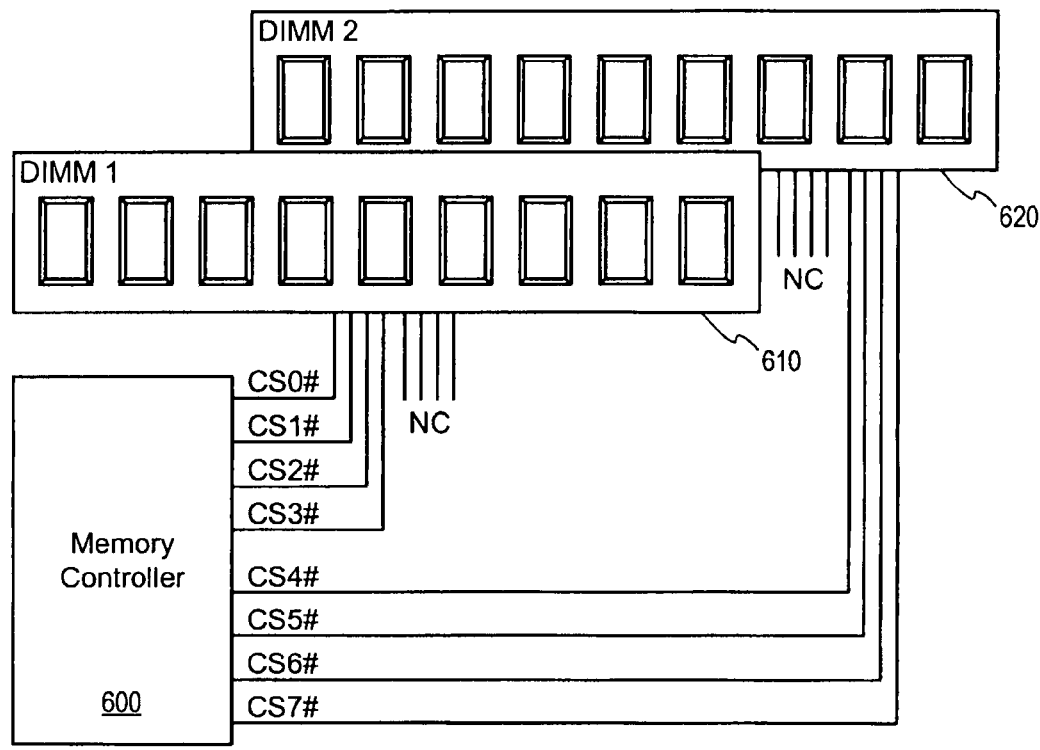
FIGS. 6A and 6B illustrates one embodiment of a buffer that provides a number of ranks on a DIMM equal to the number of valid integrated circuit selects from a host system.
Figure 6B:
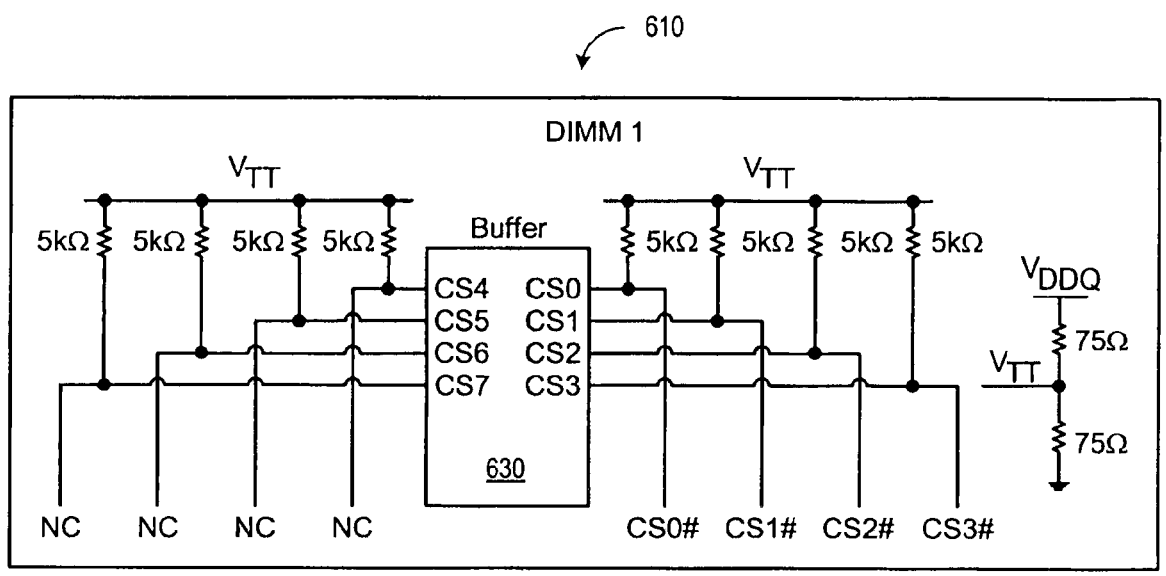

FIG. 6A illustrates a memory controller that connects to two DIMMS. Memory controller (600) from the host system drives 8 integrated circuit select (CS) lines: CS0# through CS7#. The first four lines (CS0#-CS3#) are used to select memory ranks on a first DIMM (610), and the second four lines (CS4#-CS7#) are used to select memory ranks on a second DIMM (620). FIG. 6B illustrates a buffer and pull-up circuitry on a DIMM used to configure the number of ranks on a DIMM. For this example, buffer 630 includes eight (8) integrated circuits select inputs (CS0#-CS7#). A pull-up circuit on DIMM 610 pulls the voltage on the connected integrated circuit select lines to a midway voltage value (i.e., midway between VDDQ and GND, VTT). CS0#-CS3# are coupled to buffer 630 via the pull-up circuit. CS4#-CS7# are not connected to DIMM 610. Thus, for this example, DIMM 610 configures ranks based on the CS0#-CS3# lines.

Traditional motherboard designs hard wire a subset of the integrated circuit select signals to each DIMM connector. For example, if there are four DIMM connectors per processor, two integrated circuit select signals may be hard wired to each DIMM connector. However, for the case where only two of the four DIMM connectors are populated, only 4*y memory banks are available even though the processor supports 8*y banks because only two of the four DIMM connectors are populated with DIMMs. One method to provide dynamic memory bank availability is to configure a motherboard where all the integrated circuit select signals from the host system are connected to all the DIMM connectors on the motherboard. On power up, the host system queries the number of populated DIMM connectors in the system, and then apportions the integrated circuit selects across the populated connectors.

In one embodiment, the buffer integrated circuits may be programmed on each DIMM to respond only to certain integrated circuit select signals. Again, using the example above of a processor with four dedicated DIMM connectors, consider the case where only two of the four DIMM connectors are populated. The processor may be programmed to allocate the first four integrated circuit selects (e.g., CS0# through CS3#) to the first DIMM connector and allocate the remaining four integrated circuit selects (say, CS4# through CS7#) to the second DIMM connector. Then, the processor may instruct the buffer integrated circuits on the first DIMM to respond only to signals CS0# through CS3# and to ignore signals CS4# through CS7#. The processor may also instruct the buffer integrated circuits on the second DIMM to respond only to signals CS4# through CS7# and to ignore signals CS0# through CS3#. At a later time, if the remaining two DIMM connectors are populated, the processor may then re-program the buffer integrated circuits on the first DIMM to respond only to signals CS0# and CS1#, re-program the buffer integrated circuits on the second DIMM to respond only to signals CS2# and CS3#, program the buffer integrated circuits on the third DIMM to respond to signals CS4# and CS5#, and program the buffer integrated circuits on the fourth DIMM to respond to signals CS6# and CS7#. This approach ensures that the processor of this example is capable of maintaining 8*y pages open irrespective of the number of DIMM connectors that are populated (assuming that each DIMM has the ability to support up to 8 memory ranks) In essence, this approach de-couples the number of open memory pages from the number of DIMMs in the system.

Figure 7A:
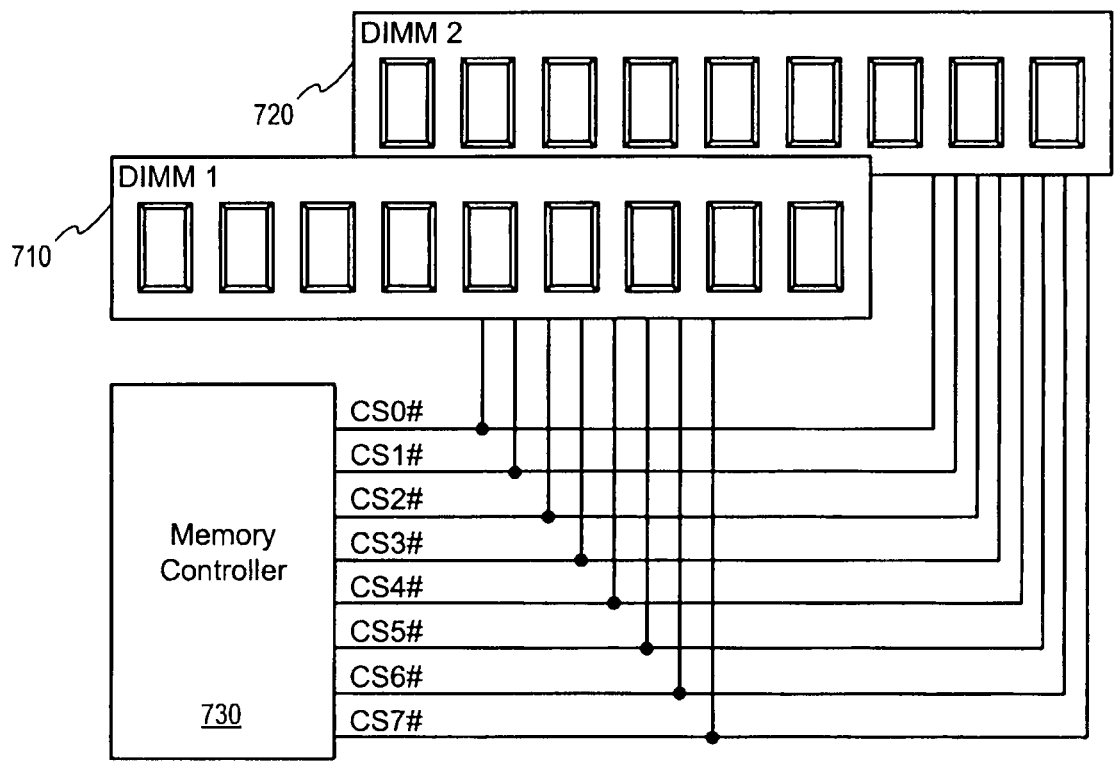
FIG. 7A illustrates a configuration between a memory controller and DIMMs.
Figure 7B:
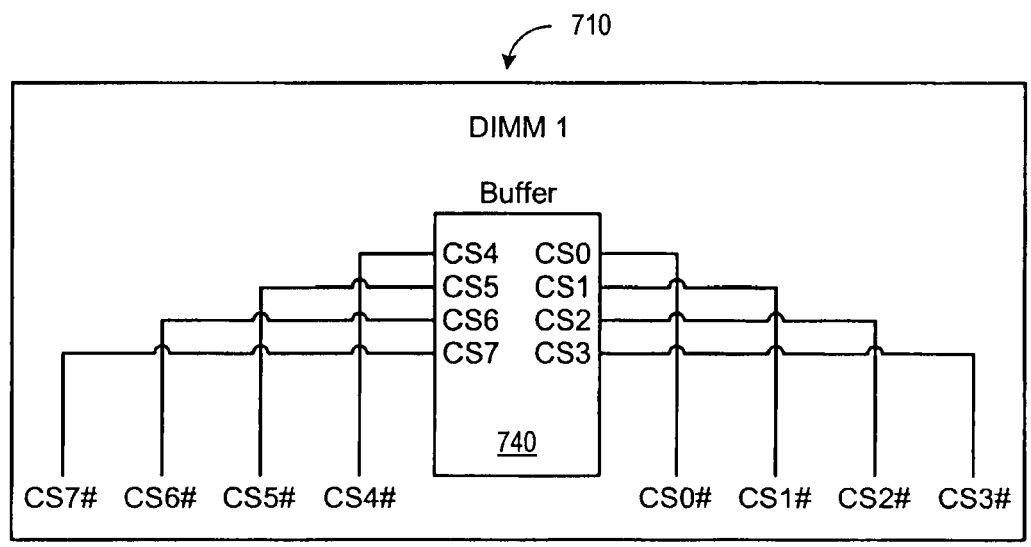
FIG. 7B illustrates the coupling of integrated circuit select lines to a buffer on a DIMM for configuring the number of ranks based on commands from the host system.

FIGS. 7A and 7B illustrate a memory system that configures the number of ranks in a DIMM based on commands from a host system. FIG. 7A illustrates a configuration between a memory controller and DIMMs. For this embodiment, all the integrated circuit select lines (e.g., CS0#-CS7#) are coupled between memory controller 730 and DIMMs 710 and 720. FIG. 7B illustrates the coupling of integrated circuit select lines to a buffer on a DIMM for configuring the number of ranks based on commands from the host system. For this embodiment, all integrated circuit select lines (CS0#-CS7#) are coupled to buffer 740 on DIMM 710.

Virtualization and multi-core processors are enabling multiple operating systems and software threads to run concurrently on a common hardware platform. This means that multiple operating systems and threads must share the memory in the server, and the resultant context switches could result in increased transfers between the hard disk and memory.

Figure 6C:
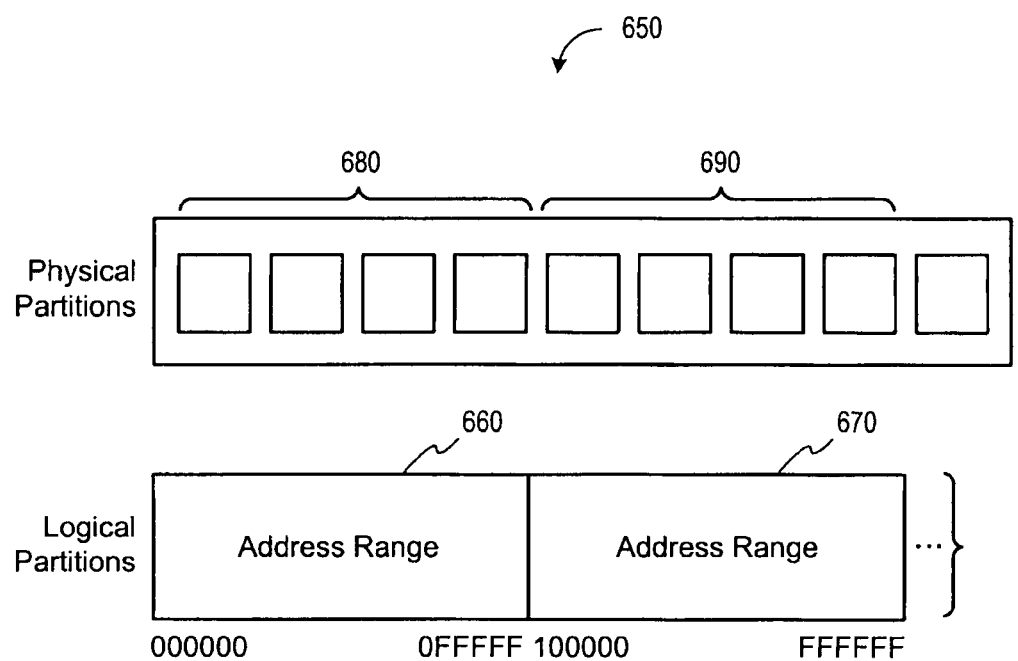
FIG. 6C illustrates one embodiment that provides a mapping between logical partitions of memory and physical partitions of memory.

In an embodiment enabling multiple operating systems and software threads to run concurrently on a common hardware platform, the buffer integrated circuit may allocate a set of one or more memory devices in a stack to a particular operating system or software thread, while another set of memory devices may be allocated to other operating systems or threads. In the example of FIG. 6C, the host system (not shown) may operate such that a first operating system is partitioned to a first logical address range 660, corresponding to physical partition 680, and all other operating systems are partitioned to a second logical address range 670, corresponding to a physical partition 690. On a context switch toward the first operating system or thread from another operating system or thread, the host system may notify the buffers on a DIMM or on multiple DIMMs of the nature of the context switch. This may be accomplished, for example, by the host system sending a command or control signal to the buffer integrated circuits either on the signal lines of the memory bus (i.e. in-band signaling) or on separate lines (i.e. side band signaling). An example of side band signaling would be to send a command to the buffer integrated circuits over an SMBus. The buffer integrated circuits may then place the memory integrated circuits allocated to the first operating system or thread 680 in an active state while placing all the other memory integrated circuits allocated to other operating systems or threads 690 (that are not currently being executed) in a low power or power down mode. This optional approach not only reduces the power dissipation in the memory stacks but also reduces accesses to the disk. For example, when the host system temporarily stops execution of an operating system or thread, the memory associated with the operating system or thread is placed in a low power mode but the contents are preserved. When the host system switches back to the operating system or thread at a later time, the buffer integrated circuits bring the associated memory out of the low power mode and into the active state and the operating system or thread may resume the execution from where it left off without having to access the disk for the relevant data. That is, each operating system or thread has a private main memory that is not accessible by other operating systems or threads. Note that this embodiment is applicable for both the single rank and the multi-rank buffer integrated circuits.

When users desire to increase the memory capacity of the host system, the normal method is to populate unused DIMM connectors with memory modules. However, when there are no more unpopulated connectors, users have traditionally removed the smaller capacity memory modules and replaced them with new, larger capacity memory modules. The smaller modules that were removed might be used on other host systems but typical practice is to discard them. It could be advantageous and cost-effective if users could increase the memory capacity of a system that has no unpopulated DIMM connectors without having to discard the modules being currently used.

In one embodiment employing a buffer integrated circuit, a connector or some other interposer is placed on the DIMM, either on the same side of the DIMM PCB as the buffer integrated circuits or on the opposite side of the DIMM PCB from the buffer integrated circuits. When a larger memory capacity is desired, the user may mechanically and electrically couple a PCB containing additional memory stacks to the DIMM PCB by means of the connector or interposer. To illustrate, an example multi-rank registered DIMM may have nine 8-bit wide stacks, where each stack contains a plurality of DRAM devices and a multi-rank buffer. For this example, the nine stacks may reside on one side of the DIMM PCB, and one or more connectors or interposers may reside on the other side of the DIMM PCB. The capacity of the DIMM may now be increased by mechanically and electrically coupling an additional PCB containing stacks of DRAM devices to the DIMM PCB using the connector(s) or interposer(s) on the DIMM PCB. For this embodiment, the multi-rank buffer integrated circuits on the DIMM PCB may detect the presence of the additional stacks and configure themselves to use the additional stacks in one or more configurations employing the additional stacks. It should be noted that it is not necessary for the stacks on the additional PCB to have the same memory capacity as the stacks on the DIMM PCB. In addition, if the stacks on the DIMM PCB may be connected to one integrated circuit select signal while the stacks on the additional PCB may be connected to another integrated circuit select signal. Alternately, the stacks on the DIMM PCB and the stacks on the additional PCB may be connected to the same set of integrated circuit select signals.

Figure 8:
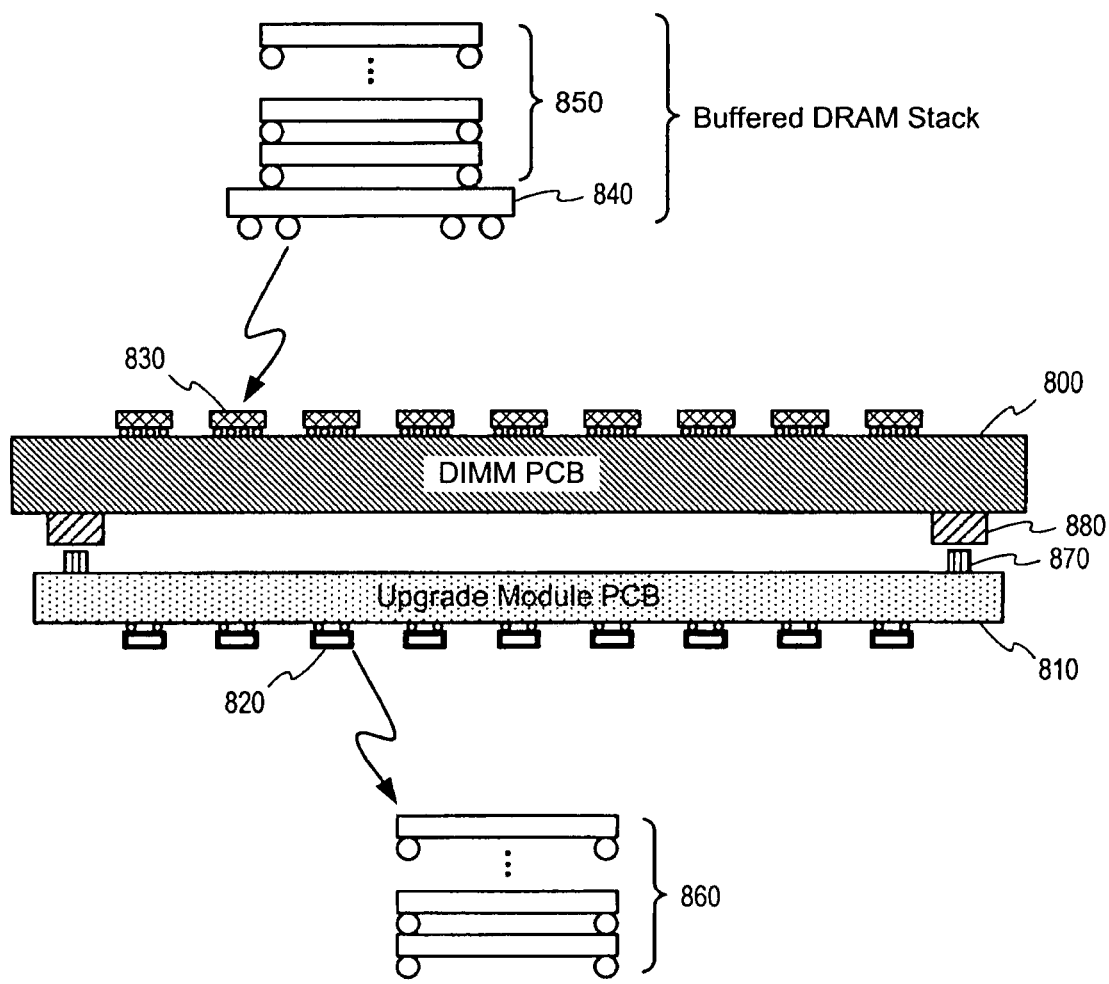
FIG. 8 illustrates one embodiment for a DIMM PCB with a connector or interposer with upgrade capability.

FIG. 8 illustrates one embodiment for a DIMM PCB with a connector or interposer with upgrade capability. A DIMM PCB 800 comprises a plurality of buffered stacks, such as buffered stack 830. As shown, buffered stack 830 includes buffer integrated circuit 840 and DRAM devices 850. An upgrade module PCB 810, which connects to DIMM PCB 800 via connector or interposer 880 and 870, includes stacks of DRAMs, such as DRAM stack 820. In this example and as shown in FIG. 8, the upgrade module PCB 810 contains nine 8-bit wide stacks, wherein each stack contains only DRAM integrated circuits 860. Each multi-rank buffer integrated circuit 840 on DIMM PCB 800, upon detection of the additional stack, re-configures itself such that it sits electrically between the host system and the two stacks of DRAM integrated circuits. That is, the buffer integrated circuit is now electrically between the host system and the stack on the DIMM PCB 800 as well as the corresponding stack on the upgrade module PCB 810. However, it should be noted that other embodiments of the buffer integrated circuit (840), the DRAM stacks (820), the DIMM PCB 800, and the upgrade module PCB 810 may be configured in various manners to achieve the same result, without deviating from the spirit or scope of the claims. For example, the stack 820 on the additional PCB may also contain a buffer integrated circuit. So, in this example, the upgrade module 810 may contain one or more buffer integrated circuits.

The buffer integrated circuits may map the addresses from the host system to the DRAM devices in the stacks in several ways. In one embodiment, the addresses may be mapped in a linear fashion, such that a bank of the virtual (or emulated) DRAM is mapped to a set of physical banks, and wherein each physical bank in the set is part of a different physical DRAM device. To illustrate, let us consider a stack containing eight 512 Mb DRAM integrated circuits (i.e. physical DRAM devices), each of which has four memory banks Let us also assume that the buffer integrated circuit is the multi-rank embodiment such that the host system sees two 2 Gb DRAM devices (i.e. virtual DRAM devices), each of which has eight banks If we label the physical DRAM devices M0 through M7, then a linear address map may be implemented as shown below.

| Host System Address (Virtual Bank) | DRAM Device (Physical Bank) |
|---|---|
| Rank 0, Bank [0] | {(M4, Bank [0]), (M0, Bank [0])} |
| Rank 0, Bank [1] | {(M4, Bank [1]), (M0, Bank [1])} |
| Rank 0, Bank [2] | {(M4, Bank [2]), (M0, Bank [2])} |

| Host System Address<br>(Virtual Bank) | DRAM Device<br>(Physical Bank) |
|---|---|
| Rank 0, Bank [3] | {(M4, Bank [3]), (M0, Bank [3])} |
| Rank 0, Bank [4] | {(M6, Bank [0]), (M2, Bank [0])} |
| Rank 0, Bank [5] | {(M6, Bank [1]), (M2, Bank [1])} |
| Rank 0, Bank [6] | {(M6, Bank [2]), (M2, Bank [2])} |
| Rank 0, Bank [7] | {(M6, Bank [3]), (M2, Bank [3])} |
| Rank 1, Bank [0] | {(M5, Bank [0]), (M1, Bank [0])} |
| Rank 1, Bank [1] | {(M5, Bank [1]), (M1, Bank [1])} |
| Rank 1, Bank [2] | {(M5, Bank [2]), (M1, Bank [2])} |
| Rank 1, Bank [3] | {(M5, Bank [3]), (M1, Bank [3])} |
| Rank 1, Bank [4] | {(M7, Bank [0]), (M3, Bank [0])} |
| Rank 1, Bank [5] | {(M7, Bank [1]), (M3, Bank [1])} |
| Rank 1, Bank [6] | {(M7, Bank [2]), (M3, Bank [2])} |
| Rank 1, Bank [7] | {(M7, Bank [3]), (M3, Bank [3])} |

Figure 9:
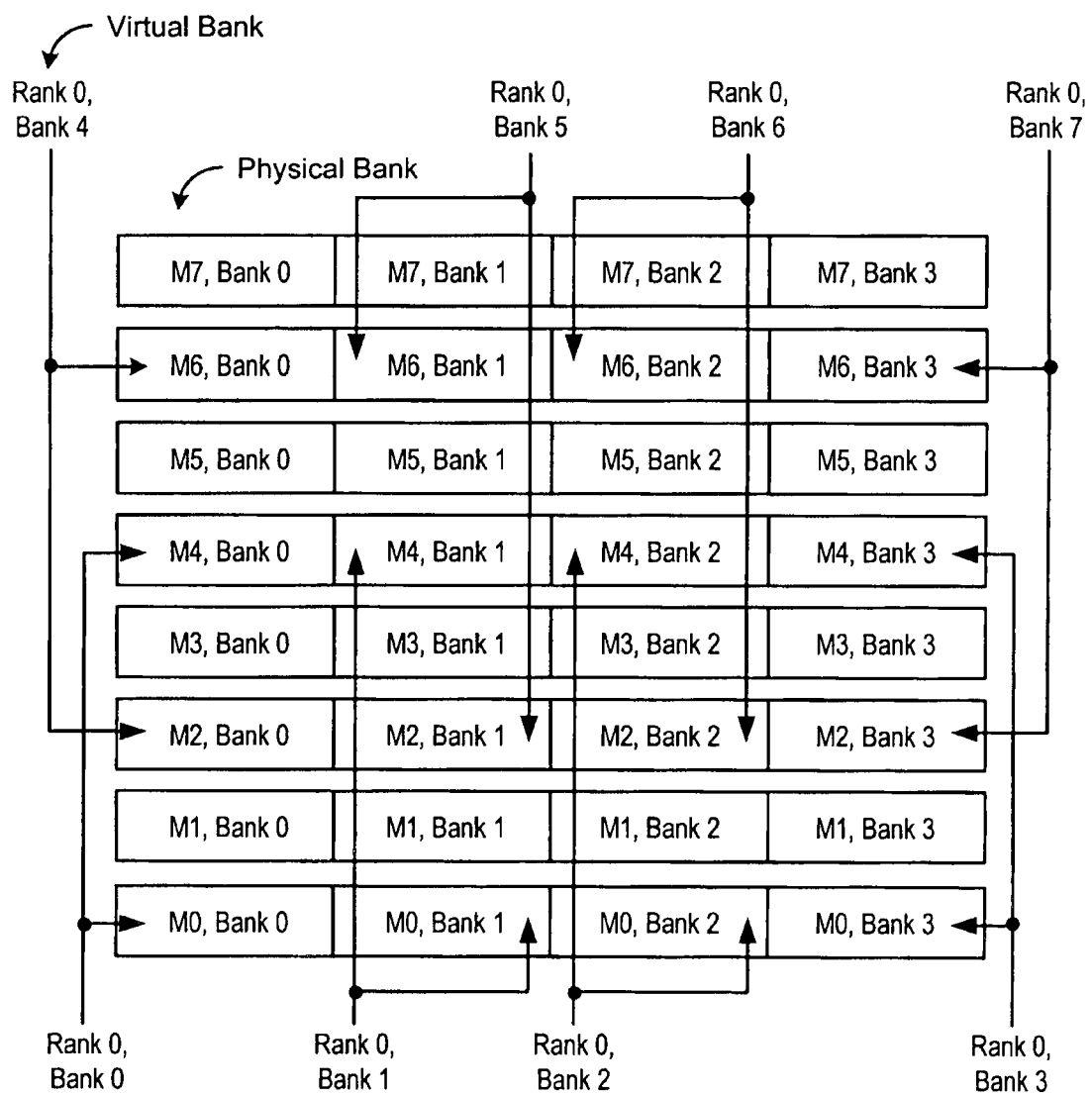
FIG. 9 illustrates an example of linear address mapping for use with a multi-rank buffer integrated circuit.

FIG. 9 illustrates an example of linear address mapping for use with a multi-rank buffer integrated circuit.

An example of a linear address mapping with a single-rank buffer integrated circuit is shown below.

| Host System Address<br>(Virtual Bank) | DRAM Device<br>(Physical Banks) |
|---|---|
| Rank 0, Bank [0] | {(M6, Bank [0]), (M4, Bank[0]), (M2, Bank [0]), (M0, Bank [0])} |
| Rank 0, Bank [1] | {(M6, Bank [1]), (M4, Bank[1]), (M2, Bank [1]), (M0, Bank [1])} |
| Rank 0, Bank [2] | {(M6, Bank [2]), (M4, Bank[2]), (M2, Bank [2]), (M0, Bank [2])} |
| Rank 0, Bank [3] | {(M6, Bank [3]), (M4, Bank[3]), (M2, Bank [3]), (M0, Bank [3])} |
| Rank 0, Bank [4] | {(M7, Bank [0]), (M5, Bank[0]), (M3, Bank [0]), (M1, Bank [0])} |
| Rank 0, Bank [5] | {(M7, Bank [1]), (M5, Bank[1]), (M3, Bank [1]), (M1, Bank [1])} |
| Rank 0, Bank [6] | {(M7, Bank [2]), (M5, Bank[2]), (M3, Bank [2]), (M1, Bank [2])} |
| Rank 0, Bank [7] | {(M7, Bank [3]), (M5, Bank[3]), (M3, Bank [3]), (M1, Bank [3])} |

Figure 10:
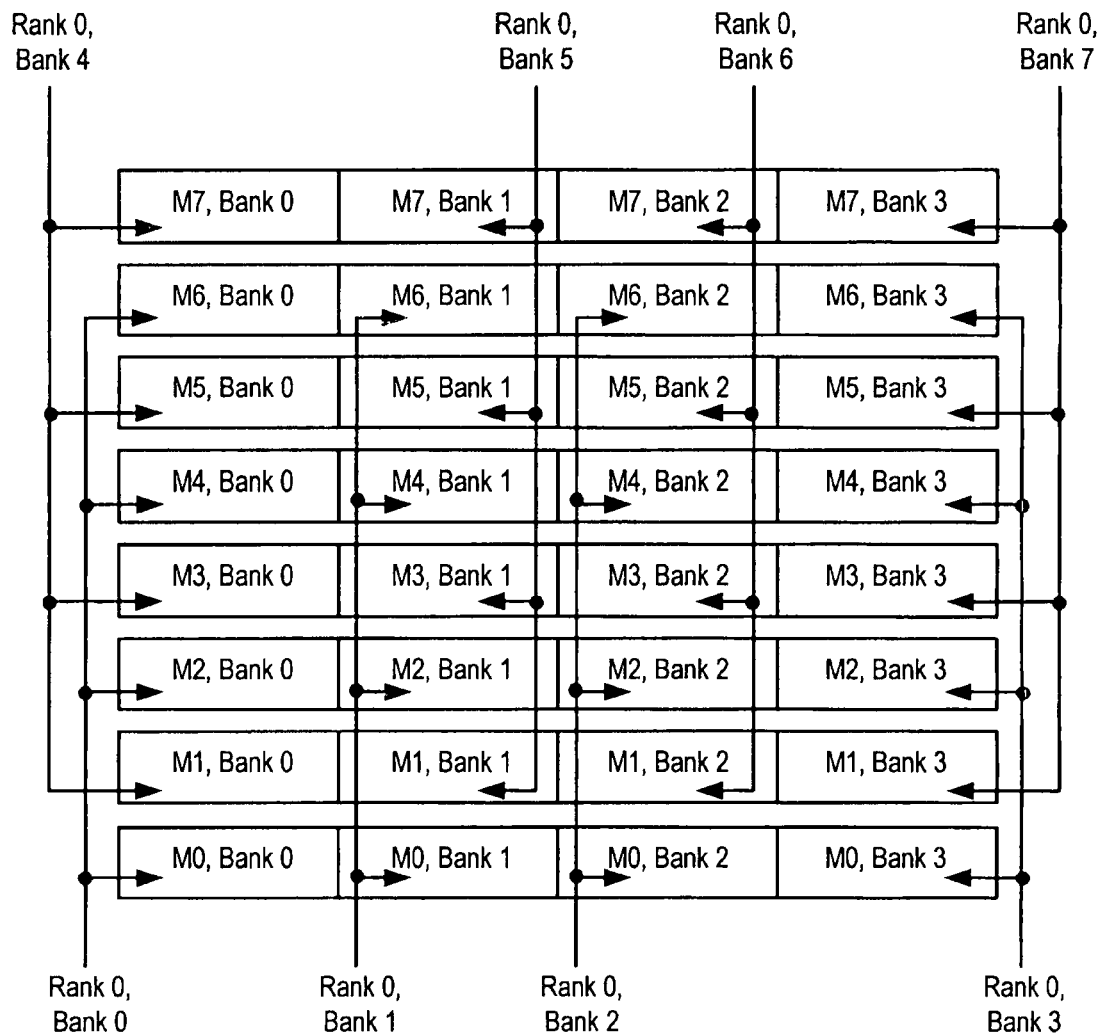
FIG. 10 illustrates an example of linear address mapping with a single rank buffer integrated circuit.

FIG. 10 illustrates an example of linear address mapping with a single rank buffer integrated circuit. Using this configuration, the stack of DRAM devices appears as a single 4 Gb integrated circuit with eight memory banks.

Figure 11:
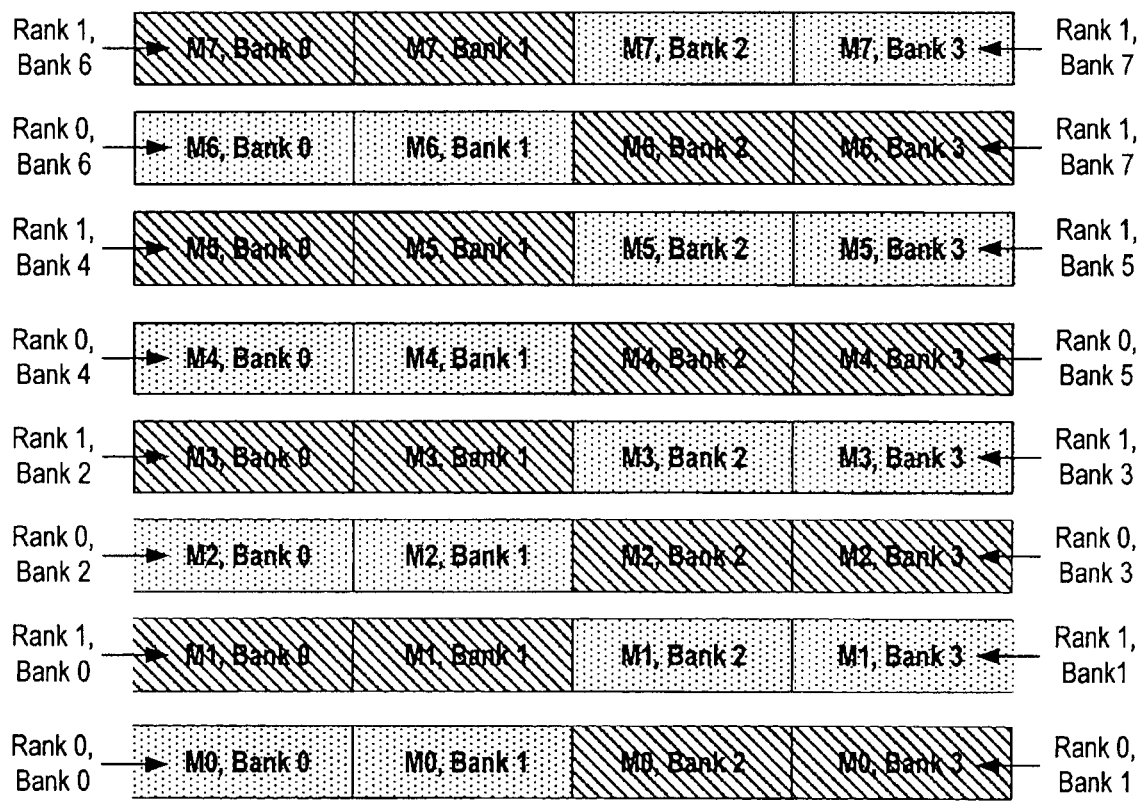
FIG. 11 illustrates an example of "bit slice" address mapping with a multi-rank buffer integrated circuit.

In another embodiment, the addresses from the host system may be mapped by the buffer integrated circuit such that one or more banks of the host system address (i.e. virtual banks) are mapped to a single physical DRAM integrated circuit in the stack ("bank slice" mapping). FIG. 11 illustrates an example of bank slice address mapping with a multi-rank buffer integrated circuit. Also, an example of a bank slice address mapping is shown below.

| Host System Address<br>(Virtual Bank) | DRAM Device<br>(Physical Bank) |
|---|---|
| Rank 0, Bank [0] | M0, Bank [1:0] |
| Rank 0, Bank [1] | M0, Bank [3:2] |
| Rank 0, Bank [2] | M2, Bank [1:0] |
| Rank 0, Bank [3] | M2, Bank [3:2] |
| Rank 0, Bank [4] | M4, Bank [1:0] |
| Rank 0, Bank [5] | M4, Bank [3:2] |
| Rank 0, Bank [6] | M6, Bank [1:0] |
| Rank 0, Bank [7] | M6, Bank [3:2] |
| Rank 1, Bank [0] | M1, Bank [1:0] |
| Rank 1, Bank [1] | M1, Bank [3:2] |
| Rank 1, Bank [2] | M3, Bank [1:0] |
| Rank 1, Bank [3] | M3, Bank [3:2] |
| Rank 1, Bank [4] | M5, Bank [1:0] |
| Rank 1, Bank [5] | M5, Bank [3:2] |
| Rank 1, Bank [6] | M7, Bank [1:0] |
| Rank 1, Bank [7] | M7, Bank [3:2] |

The stack of this example contains eight 512 Mb DRAM integrated circuits, each with four memory banks In this example, a multi-rank buffer integrated circuit is assumed, which means that the host system sees the stack as two 2 Gb DRAM devices, each having eight banks.

Figure 12:
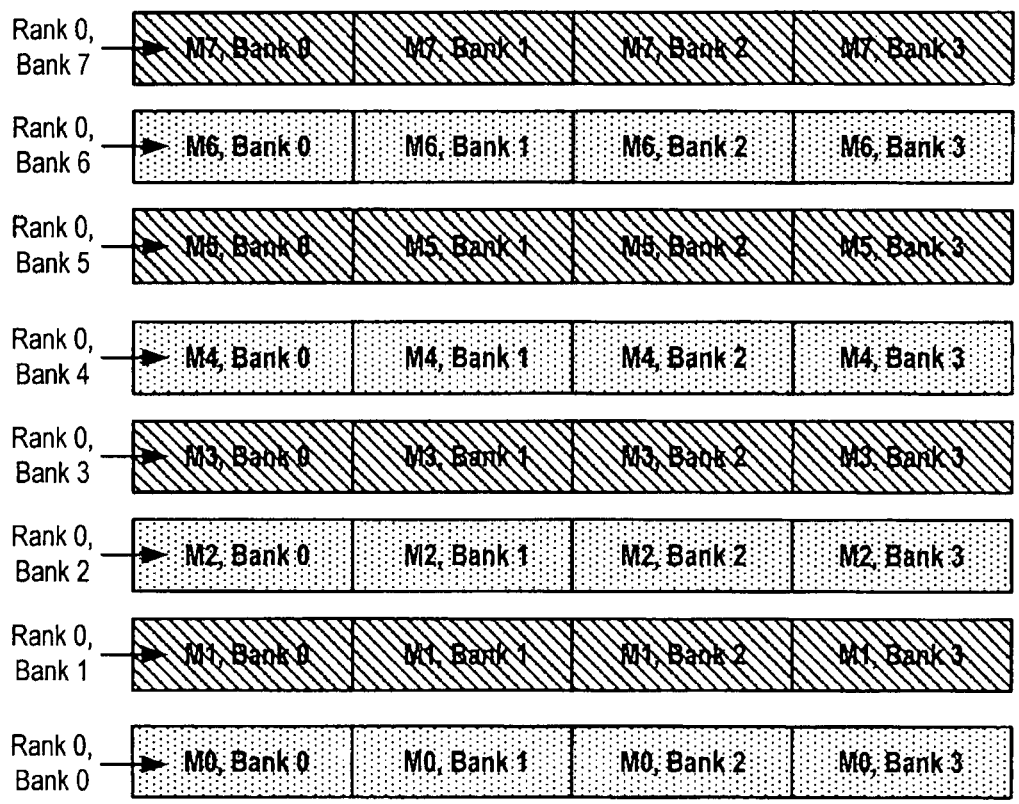
FIG. 12 illustrates an example of "bit slice" address mapping with a single rank buffer integrated circuit.

FIG. 12 illustrates an example of bank slice address mapping with a single rank buffer integrated circuit. The bank slice mapping with a single-rank buffer integrated circuit is shown below.

| Host System Address<br>(Virtual Bank) | DRAM Device<br>(Physical Device) |
|---|---|
| Rank 0, Bank [0] | M0 |
| Rank 0, Bank [1] | M1 |
| Rank 0, Bank [2] | M2 |
| Rank 0, Bank [3] | M3 |
| Rank 0, Bank [4] | M4 |
| Rank 0, Bank [5] | M5 |
| Rank 0, Bank [6] | M6 |
| Rank 0, Bank [7] | M7 |

The stack of this example contains eight 512 Mb DRAM devices so that the host system sees the stack as a single 4 Gb device with eight banks. The address mappings shown above are for illustrative purposes only. Other mappings may be implemented without deviating from the spirit and scope of the claims.

Bank slice address mapping enables the virtual DRAM to reduce or eliminate some timing constraints that are inherent in the underlying physical DRAM devices. For instance, the physical DRAM devices may have a tFAW (4 bank activate window) constraint that limits how frequently an activate operation may be targeted to a physical DRAM device. However, a virtual DRAM circuit that uses bank slice address mapping may not have this constraint. As an example, the address mapping in FIG. 11 maps two banks of the virtual DRAM device to a single physical DRAM device. So, the tFAW constraint is eliminated because the $t_{RC}$ timing parameter prevents the host system from issuing more than two consecutive activate commands to any given physical DRAM device within a $t_{RC}$ window (and $t_{RC} > t_{FAW}$). Similarly, a virtual DRAM device that uses the address mapping in FIG. 12 eliminates the $t_{RRD}$ constraint of the underlying physical DRAM devices.

In addition, a bank slice address mapping scheme enables the buffer integrated circuit or the host system to power manage the DRAM devices on a DIMM on a more granular level. To illustrate this, consider a virtual DRAM device that uses the address mapping shown in FIG. 12, where each bank of the virtual DRAM device corresponds to a single physical DRAM device. So, when bank 0 of the virtual DRAM device (i.e. virtual bank 0) is accessed, the corresponding physical DRAM device M0 may be in the active mode. However, when there is no outstanding access to virtual bank 0, the buffer integrated circuit or the host system (or any other entity in the system) may place DRAM device M0 in a low power (e.g.

power down) mode. While it is possible to place a physical DRAM device in a low power mode, it is not possible to place a bank (or portion) of a physical DRAM device in a low power mode while the remaining banks (or portions) of the DRAM device are in the active mode. However, a bank or set of banks of a virtual DRAM circuit may be placed in a low power mode while other banks of the virtual DRAM circuit are in the active mode since a plurality of physical DRAM devices are used to emulate a virtual DRAM device. It can be seen from FIG. 12 and FIG. 10, for example, that fewer virtual banks are mapped to a physical DRAM device with bank slice mapping (FIG. 12) than with linear mapping (FIG. 10). Thus, the likelihood that all the (physical) banks in a physical DRAM device are in the precharge state at any given time is higher with bank slice mapping than with linear mapping. Therefore, the buffer integrated circuit or the host system (or some other entity in the system) has more opportunities to place various physical DRAM devices in a low power mode when bank slide mapping is used.

In several market segments, it may be desirable to preserve the contents of main memory (usually, DRAM) either periodically or when certain events occur. For example, in the supercomputer market, it is common for the host system to periodically write the contents of main memory to the hard drive. That is, the host system creates periodic checkpoints. This method of checkpointing enables the system to re-start program execution from the last checkpoint instead of from the beginning in the event of a system crash. In other markets, it may be desirable for the contents of one or more address ranges to be periodically stored in non-volatile memory to protect against power failures or system crashes. All these features may be optionally implemented in a buffer integrated circuit disclosed herein by integrating one or more non-volatile memory integrated circuits (e.g. flash memory) into the stack. In some embodiments, the buffer integrated circuit is designed to interface with one or more stacks containing DRAM devices and non-volatile memory integrated circuits. Note that each of these stacks may contain only DRAM devices or contain only non-volatile memory integrated circuits or contain a mixture of DRAM and non-volatile memory integrated circuits.

Figure 13A:
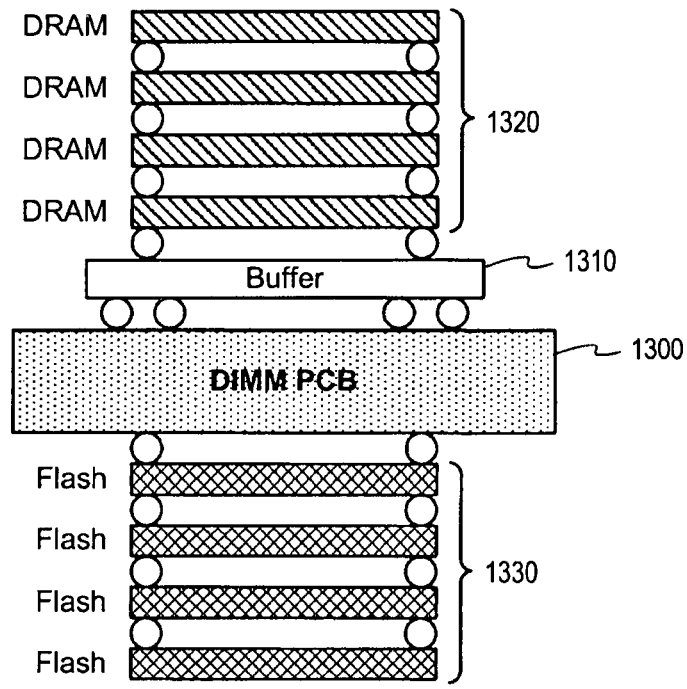
FIGS. 13A and 13B illustrate examples of buffered stacks that contain DRAM and non-volatile memory integrated circuits.
Figure 13B:
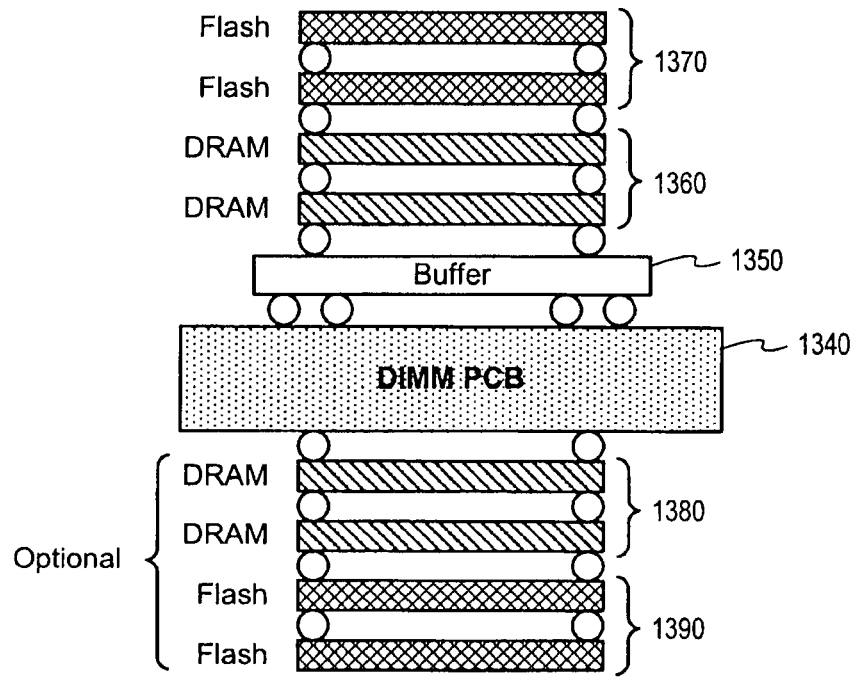

FIGS. 13A and 13B illustrate examples of buffered stacks that contain both DRAM and non-volatile memory integrated circuits. A DIMM PCB 1300 includes a buffered stack (buffer 1310 and DRAMs 1320) and flash 1330. In another embodiment shown in FIG. 13B, DIMM PCB 1340 includes a buffered stack (buffer 1350, DRAMs 1360 and flash 1370). An optional non-buffered stack includes at least one non-volatile memory device (e.g., flash 1390) or DRAM device 1380. All the stacks that connect to a buffer integrated circuit may be on the same PCB as the buffer integrated circuit or some of the stacks may be on the same PCB while other stacks may be on another PCB that is electrically and mechanically coupled by means of a connector or an interposer to the PCB containing the buffer integrated circuit.

In some embodiments, the buffer integrated circuit copies some or all of the contents of the DRAM devices in the stacks that it interfaces with to the non-volatile memory integrated circuits in the stacks that it interfaces with. This event may be triggered, for example, by a command or signal from the host system to the buffer integrated circuit, by an external signal to the buffer integrated circuit, or upon the detection (by the buffer integrated circuit) of an event or a catastrophic condition like a power failure. As an example, let us assume that a buffer integrated circuit interfaces with a plurality of stacks that contain 4 Gb of DRAM memory and 4 Gb of non-volatile memory. The host system may periodically issue a command to the buffer integrated circuit to copy the contents of the DRAM memory to the non-volatile memory. That is, the host system periodically checkpoints the contents of the DRAM memory. In the event of a system crash, the contents of the DRAM may be restored upon re-boot by copying the contents of the non-volatile memory back to the DRAM memory. This provides the host system with the ability to periodically check point the memory.

In another embodiment, the buffer integrated circuit may monitor the power supply rails (i.e. voltage rails or voltage planes) and detect a catastrophic event, for example, a power supply failure. Upon detection of this event, the buffer integrated circuit may copy some or all the contents of the DRAM memory to the non-volatile memory. The host system may also provide a non-interruptible source of power to the buffer integrated circuit and the memory stacks for at least some period of time after the power supply failure to allow the buffer integrated circuit to copy some or all the contents of the DRAM memory to the non-volatile memory. In other embodiments, the memory module may have a built-in backup source of power for the buffer integrated circuits and the memory stacks in the event of a host system power supply failure. For example, the memory module may have a battery or a large capacitor and an isolation switch on the module itself to provide backup power to the buffer integrated circuits and the memory stacks in the event of a host system power supply failure.

A memory module, as described above, with a plurality of buffers, each of which interfaces to one or more stacks containing DRAM and non-volatile memory integrated circuits, may also be configured to provide instant-on capability. This may be accomplished by storing the operating system, other key software, and frequently used data in the non-volatile memory.

In the event of a system crash, the memory controller of the host system may not be able to supply all the necessary signals needed to maintain the contents of main memory. For example, the memory controller may not send periodic refresh commands to the main memory, thus causing the loss of data in the memory. The buffer integrated circuit may be designed to prevent such loss of data in the event of a system crash. In one embodiment, the buffer integrated circuit may monitor the state of the signals from the memory controller of the host system to detect a system crash. As an example, the buffer integrated circuit may be designed to detect a system crash if there has been no activity on the memory bus for a pre-determined or programmable amount of time or if the buffer integrated circuit receives an illegal or invalid command from the memory controller. Alternately, the buffer integrated circuit may monitor one or more signals that are asserted when a system error or system halt or system crash has occurred. For example, the buffer integrated circuit may monitor the HT_SyncFlood signal in an Opteron processor based system to detect a system error. When the buffer integrated circuit detects this event, it may de-couple the memory bus of the host system from the memory integrated circuits in the stack and internally generate the signals needed to preserve the contents of the memory integrated circuits until such time as the host system is operational. So, for example, upon detection of a system crash, the buffer integrated circuit may ignore the signals from the memory controller of the host system and instead generate legal combinations of signals like CKE, CS#, RAS#, CAS#, and WE# to maintain the data stored in the DRAM devices in the stack, and also generate periodic refresh signals for the DRAM integrated circuits.

Note that there are many ways for the buffer integrated circuit to detect a system crash, and all these variations fall within the scope of the claims.

Placing a buffer integrated circuit between one or more stacks of memory integrated circuits and the host system allows the buffer integrated circuit to compensate for any skews or timing variations in the signals from the host system to the memory integrated circuits and from the memory integrated circuits to the host system. For example, at higher speeds of operation of the memory bus, the trace lengths of signals between the memory controller of the host system and the memory integrated circuits are often matched. Trace length matching is challenging especially in small form factor systems. Also, DRAM processes do not readily lend themselves to the design of high speed I/O circuits. Consequently, it is often difficult to align the I/O signals of the DRAM integrated circuits with each other and with the associated data strobe and clock signals.

In one embodiment of a buffer integrated circuit, circuitry that adjusts the timing of the I/O signals may be incorporated. In other words, the buffer integrated circuit may have the ability to do per-pin timing calibration to compensate for skews or timing variations in the I/O signals. For example, say that, the DQ[0] data signal between the buffer integrated circuit and the memory controller has a shorter trace length or has a smaller capacitive load than the other data signals, DQ[7:1]. This results in a skew in the data signals since not all the signals arrive at the buffer integrated circuit (during a memory write) or at the memory controller (during a memory read) at the same time. When left uncompensated, such skews tend to limit the maximum frequency of operation of the memory sub-system of the host system. By incorporating per-pin timing calibration and compensation circuits into the I/O circuits of the buffer integrated circuit, the DQ[0] signal may be driven later than the other data signals by the buffer integrated circuit (during a memory read) to compensate for the shorter trace length of the DQ[O] signal. Similarly, the per-pin timing calibration and compensation circuits allow the buffer integrated circuit to delay the DQ[O] data signal such that all the data signals, DQ[7:0], are aligned for sampling during a memory write operation. The per-pin timing calibration and compensation circuits also allow the buffer integrated circuit to compensate for timing variations in the I/O pins of the DRAM devices. A specific pattern or sequence may be used by the buffer integrated circuit to perform the per-pin timing calibration of the signals that connect to the memory controller of the host system and the per-pin timing calibration of the signals that connect to the memory devices in the stack.

Incorporating per-pin timing calibration and compensation circuits into the buffer integrated circuit also enables the buffer integrated circuit to gang a plurality of slower DRAM devices to emulate a higher speed DRAM integrated circuit to the host system. That is, incorporating per-pin timing calibration and compensation circuits into the buffer integrated circuit also enables the buffer integrated circuit to gang a plurality of DRAM devices operating at a first clock speed and emulate to the host system one or more DRAM integrated circuits operating at a second clock speed, wherein the first clock speed is slower than the second clock speed.

For example, the buffer integrated circuit may operate two 8-bit wide DDR2 SDRAM devices-in parallel at a 533 MHz data rate such that the host system sees a single 8-bit wide DDR2 SDRAM integrated circuit that operates at a 1066 MHz data rate. Since, in this example, the two DRAM devices are DDR2 devices, they are designed to transmit or receive four data bits on each data pin for a memory read or write respectively (for a burst length of 4). So, the two DRAM devices operating in parallel may transmit or receive sixty four bits per data pin per memory read or write respectively in this example. Since the host system sees a single DDR2 integrated circuit behind the buffer, it will only receive or transmit thirty-two data bits per pin per memory read or write respectively. In order to accommodate for the different data widths, the buffer integrated circuit may make use of the DM signal (Data Mask). Say that the host system sends DA[7:0], DB[7:0], DC[7:0], and DD[7:0] to the buffer integrated circuit at a 1066 MHz data rate. The buffer integrated circuit may send DA[7:0], DC[7:0], XX, and XX to the first DDR2 SDRAM integrated circuit and send DB[7:0], DD[7:0], XX, and XX to the second DDR2 SDRAM integrated circuit, where XX denotes data that is masked by the assertion (by the buffer integrated circuit) of the DM inputs to the DDR2 SDRAM integrated circuits.

In another embodiment, the buffer integrated circuit operates two slower DRAM devices as a single, higher-speed, wider DRAM. To illustrate, the buffer integrated circuit may operate two 8-bit wide DDR2 SDRAM devices running at 533 MHz data rate such that the host system sees a single 16-bit wide DDR2 SDRAM integrated circuit operating at a 1066 MHz data rate. In this embodiment, the buffer integrated circuit may not use the DM signals. In another embodiment, the buffer integrated circuit may be designed to operate two DDR2 SDRAM devices (in this example, 8-bit wide, 533 MHz data rate integrated circuits) in parallel, such that the host system sees a single DDR3 SDRAM integrated circuit (in this example, an 8-bit wide, 1066 MHz data rate, DDR3 device). In another embodiment, the buffer integrated circuit may provide an interface to the host system that is narrower and faster than the interface to the DRAM integrated circuit. For example, the buffer integrated circuit may have a 16-bit wide, 533 MHz data rate interface to one or more DRAM devices but have an 8-bit wide, 1066 MHz data rate interface to the host system.

In addition to per-pin timing calibration and compensation capability, circuitry to control the slew rate (i.e. the rise and fall times), pull-up capability or strength, and pull-down capability or strength may be added to each I/O pin of the buffer integrated circuit or optionally, in common to a group of I/O pins of the buffer integrated circuit. The output drivers and the input receivers of the buffer integrated circuit may have the ability to do pre-emphasis in order to compensate for non-uniformities in the traces connecting the buffer integrated circuit to the host system and to the memory integrated circuits in the stack, as well as to compensate for the characteristics of the I/O pins of the host system and the memory integrated circuits in the stack.

Stacking a plurality of memory integrated circuits (both volatile and non-volatile) has associated thermal and power delivery characteristics. Since it is quite possible that all the memory integrated circuits in a stack may be in the active mode for extended periods of time, the power dissipated by all these integrated circuits may cause an increase in the ambient, case, and junction temperatures of the memory integrated circuits. Higher junction temperatures typically have negative impact on the operation of ICs in general and DRAMs in particular. Also, when a plurality of DRAM devices are stacked on top of each other such that they share voltage and ground rails (i.e. power and ground traces or planes), any simultaneous operation of the integrated circuits may cause large spikes in the voltage and ground rails. For example, a large current may be drawn from the voltage rail when all the DRAM devices in a stack are refreshed simultaneously, thus causing a significant disturbance (or spike) in the voltage and ground rails. Noisy voltage and ground rails affect the operation of the DRAM devices especially at high speeds. In order to address both these phenomena, several inventive techniques are disclosed below.

One embodiment uses a stacking technique wherein one or more layers of the stack have decoupling capacitors rather than memory integrated circuits. For example, every fifth layer in the stack may be a power supply decoupling layer (with the other four layers containing memory integrated circuits). The layers that contain memory integrated circuits are designed with more power and ground balls or pins than are present in the pin out of the memory integrated circuits. These extra power and ground balls are preferably disposed along all the edges of the layers of the stack.

FIGS. 14A, 14B and 14C illustrate one embodiment of a buffered stack with power decoupling layers. As shown in FIG. 14A, DIMM PCB 1400 includes a buffered stack of DRAMs including decoupling layers. Specifically, for this embodiment, the buffered stack includes buffer 1410, a first set of DRAM devices 1420, a first decoupling layer 1430, a second set of DRAM devices 1440, and an optional second decoupling layer 1450. The stack also has an optional heat sink or spreader 1455.

FIG. 14B illustrates top and side views of one embodiment for a DRAM die. A DRAM die 1460 includes a package (stack layer) 1466 with signal/power/GND balls 1462 and one or more extra power/GND balls 1464. The extra power/GND balls 1464 increase thermal conductivity.

FIG. 14C illustrates top and side views of one embodiment of a decoupling layer. A decoupling layer 1475 includes one or more decoupling capacitors 1470, signal/power/GND balls 1485, and one or more extra power/GND balls 1480. The extra power/GND balls 1480 increases thermal conductivity.

The extra power and ground balls, shown in FIGS. 14B and 14C, form thermal conductive paths between the memory integrated circuits and the PCB containing the stacks, and between the memory integrated circuits and optional heat sinks or heat spreaders. The decoupling capacitors in the power supply decoupling layer connect to the relevant power and ground pins in order to provide quiet voltage and ground rails to the memory devices in the stack. The stacking technique described above is one method of providing quiet power and ground rails to the memory integrated circuits of the stack and also to conduct heat away from the memory integrated circuits.

In another embodiment, the noise on the power and ground rails may be reduced by preventing the DRAM integrated circuits in the stack from performing an operation simultaneously. As mentioned previously, a large amount of current will be drawn from the power rails if all the DRAM integrated circuits in a stack perform a refresh operation simultaneously. The buffer integrated circuit may be designed to stagger or spread out the refresh commands to the DRAM integrated circuits in the stack such that the peak current drawn from the power rails is reduced. For example, consider a stack with four 1 Gb DDR2 SDRAM integrated circuits that are emulated by the buffer integrated circuit to appear as a single 4 Gb DDR2 SDRAM integrated circuit to the host system. The JEDEC specification provides for a refresh cycle time (i.e. $t_{RFC}$) of 400 ns for a 4 Gb DRAM integrated circuit while a 1 Gb DRAM integrated circuit has a $t_{RFC}$ specification of 110 ns. So, when the host system issues a refresh command to the emulated 4 Gb DRAM integrated circuit, it expects the refresh to be done in 400 ns. However, since the stack contains four 1 Gb DRAM integrated circuits, the buffer integrated circuit may issue separate refresh commands to each of the 1 Gb DRAM integrated circuit in the stack at staggered intervals. As an example, upon receipt of the refresh command from the host system, the buffer integrated circuit may issue a refresh command to two of the four 1 Gb DRAM integrated circuits, and 200 ns later, issue a separate refresh command to the remaining two 1 Gb DRAM integrated circuits. Since the 1 Gb DRAM integrated circuits require 110 ns to perform the refresh operation, all four 1 Gb DRAM integrated circuits in the stack will have performed the refresh operation before the 400 ns refresh cycle time (of the 4 Gb DRAM integrated circuit) expires. This staggered refresh operation limits the maximum current that may be drawn from the power rails. It should be noted that other implementations that provide the same benefits are also possible, and are covered by the scope of the claims.

In one embodiment, a device for measuring the ambient, case, or junction temperature of the memory integrated circuits (e.g. a thermal diode) can be embedded into the stack. Optionally, the buffer integrated circuit associated with a given stack may monitor the temperature of the memory integrated circuits. When the temperature exceeds a limit, the buffer integrated circuit may take suitable action to prevent the overheating of and possible damage to the memory integrated circuits. The measured temperature may optionally be made available to the host system.

Other features may be added to the buffer integrated circuit so as to provide optional features. For example, the buffer integrated circuit may be designed to check for memory errors or faults either on power up or when the host system instructs it do so. During the memory check, the buffer integrated circuit may write one or more patterns to the memory integrated circuits in the stack, read the contents back, and compare the data read back with the written data to check for stuck-at faults or other memory faults.

Although the present invention has been described in terms of specific exemplary embodiments, it will be appreciated that various modifications and alterations might be made by those skilled in the art without departing from the spirit and scope of the claims.

What is claimed is:

1. A memory module comprising:
   a memory stack comprising a first physical memory device and a second physical memory device, wherein each of the first physical memory device and the second physical memory device comprises a respective plurality of physical memory banks; and
   a buffer circuit coupled to a memory controller, the buffer circuit configured to:
      communicate with the memory stack and the memory controller;
      simulate a virtual memory device having a first virtual memory bank and a second virtual memory bank, the first virtual memory bank simulated using at least a particular physical memory bank of the first physical memory device, and the second virtual memory bank simulated using at least a particular physical memory bank of the second physical memory device;
      present the virtual memory device to the memory controller; and
      perform a per-pin timing calibration to compensate for timing variations between signals received from the first physical memory device and signals received from the second physical memory device.

2. The memory module of claim 1, wherein the buffer circuit is configured to gang the first physical memory device and the second physical memory device operating at a first clock speed to simulate the virtual memory device operating at a second clock speed.

3. The memory module of claim 1, wherein the buffer circuit is configured to map a virtual memory address to a physical memory address for the memory controller to access data in the memory stack.

4. The memory module of claim 1, wherein a trace length between the buffer circuit and the first physical memory device is shorter than a trace length between the buffer circuit and the second physical memory device, and wherein the buffer circuit is configured to delay a data signal from the first physical memory device such that the data signal from the first physical memory device and a data signal from the second physical memory device arrive at the memory controller at a same time during a read operation.

5. The memory module of claim 1, wherein a trace length between the buffer circuit and the first physical memory device is shorter than a trace length between the buffer circuit and the second physical memory device, and wherein the buffer circuit is configured to delay a data signal to the first physical memory device such that the data signal to the first physical memory device is aligned with a data signal to the second physical memory device during a write operation.

6. The memory module of claim 5, wherein the buffer circuit is configured to simulate the virtual memory device to eliminate a timing constraint associated with the first physical memory device and the second physical memory device using the bank-slice address mapping.

7. The memory module of claim 6, wherein the timing constraint includes a 4-bank activate window (tFAW) constraint.

8. The memory module of claim 1, wherein the memory stack and the buffer circuit form a stack.

9. The memory module of claim 1, wherein the buffer circuit is configured to:
receive a command from the memory controller to access the first virtual memory bank of the virtual memory device; and
in response to receiving the command from the memory controller to access the first virtual memory bank of the virtual memory device, (i) issue a first power-management command to place the first physical memory device in an active mode, and (ii) issue a second power-management command to place the second physical memory device in a low power mode.

10. The memory module of claim 1, wherein the timing variations are associated with trace lengths between the buffer circuit and the physical memory devices.

11. A method comprising:
communicating with a memory stack and a memory controller, wherein the memory stack includes a first physical memory device and a second physical memory device, and wherein each of the first physical memory device and the second physical memory device includes a respective plurality of physical memory banks;
simulating a virtual memory device having a first virtual memory bank and a second virtual memory bank, the first virtual memory bank simulated using at least a particular physical memory bank of the first physical memory device, and the second virtual memory bank simulated using at least a particular physical memory bank of the second physical memory device;
presenting the virtual memory device to the memory controller; and
performing a per-pin timing calibration to compensate for timing variations between signals received from the first physical memory device and signals received from the second physical memory device.

12. The method of claim 11, wherein simulating a virtual memory device comprises ganging the first physical memory device and the second physical memory device operating at a first clock speed to simulate the virtual memory device operating at a second clock speed, the first clock speed slower than the second clock speed.

13. The method of claim 11, comprising delaying a data signal from the first physical memory device such that the data signal from the first physical memory device and a data signal from the second physical memory device arrive at the memory controller at a same time during a read operation.

14. The method of claim 11, comprising delaying a data signal to the first physical memory device such that the data signal to the first physical memory device is aligned with a data signal to the second physical memory device during a write operation.

15. The method of claim 14, wherein simulating a virtual memory device comprises simulating the virtual memory device to eliminate a timing constraint associated with the first physical memory device and the second physical memory device using the bank-slice address mapping.

16. The method of claim 11, comprising:
receiving a command from the memory controller to access the first virtual memory bank of the virtual memory device; and
in response to receiving the command from the memory controller to access the first virtual memory bank of the virtual memory device, (i) issuing a first power-management command to place the first physical memory device in an active mode, and (ii) issuing a second power-management command to place the second physical memory device in a low power mode.

17. An apparatus comprising:
a host system comprising a memory controller; and
a dual in-line memory module (DIMM) comprising:
a memory stack comprising a first physical dynamic random access memory (DRAM) integrated circuit and a second physical DRAM integrated circuit, wherein each of the first physical DRAM integrated circuit and the second physical DRAM integrated circuit comprises a respective plurality of physical memory banks; and
a buffer circuit coupled to the memory controller, the buffer circuit configured to:
communicate with the memory stack and the memory controller;
simulate a virtual DRAM integrated circuit having a first virtual memory bank and a second virtual memory bank, the first virtual memory bank simulated using at least a particular physical memory bank of the first physical DRAM integrated circuit, and the second virtual memory bank simulated using at least a particular physical memory bank of the second physical DRAM integrated circuit;
present the virtual DRAM integrated circuit to the memory controller; and
perform a per-pin timing calibration to compensate for timing variations between signals received from the first physical DRAM integrated circuit and signals received from the second physical DRAM integrated circuit.

18. The apparatus of claim 17, wherein the buffer circuit is configured to gang the first physical DRAM integrated circuit and the second physical DRAM integrated circuit operating at a first clock speed to simulate the virtual DRAM integrated circuit operating at a second clock speed, the first clock speed slower than the second clock speed.

19. The apparatus of claim 17, wherein the buffer circuit is configured to map a virtual memory address to a physical memory address for the memory controller to access data in the memory stack.

20. The apparatus of claim 17, wherein a trace length between the buffer circuit and the first physical memory device is shorter than a trace length between the buffer circuit and the second physical memory device, and wherein the buffer circuit is configured to delay a data signal from the first physical memory device such that the data signal from the first physical memory device and a data signal from the second physical memory device arrive at the memory controller at a same time during a read operation.

* * * * *